US007911027B2

(12) United States Patent
Itoh et al.

(10) Patent No.: US 7,911,027 B2
(45) Date of Patent: Mar. 22, 2011

(54) SEMICONDUCTOR DEVICE, METHOD OF GENERATING PATTERN FOR SEMICONDUCTOR DEVICE, METHOD OF MANUFACTURING SEMICONDUCTOR DEVICE, AND APPARATUS FOR GENERATING PATTERN FOR SEMICONDUCTOR DEVICE

(75) Inventors: Mitsumi Itoh, Kyoto (JP); Masatoshi Sawada, Shiga (JP); Junko Honma, Kyoto (JP); Kenji Shimazaki, Hyogo (JP); Hiroyuki Tsujikawa, Shiga (JP); Hiroshi Benno, Osaka (JP)

(73) Assignee: Panasonic Corporation, Osaka (JP)

( * ) Notice: Subject to any disclaimer, the term of this patent is extended or adjusted under 35 U.S.C. 154(b) by 867 days.

(21) Appl. No.: 11/783,465

(22) Filed: Apr. 10, 2007

(65) Prior Publication Data

US 2007/0187777 A1 Aug. 16, 2007

Related U.S. Application Data

(62) Division of application No. 10/496,297, filed on May 21, 2004, now Pat. No. 7,307,333.

(30) Foreign Application Priority Data

Nov. 21, 2001 (JP) .............................. P2001-356279

(51) Int. Cl.
*H01L 29/00* (2006.01)
(52) U.S. Cl. ................ 257/532; 257/202; 257/E21.423; 257/E21.679; 257/E27.103; 257/E29.309
(58) Field of Classification Search .................. 257/202, 257/E21.423, E27.103, E29.309, E21.679, 257/532
See application file for complete search history.

(56) References Cited

U.S. PATENT DOCUMENTS 5,012,309 A * 4/1991 Nakayama .................... 257/204
5,635,736 A * 6/1997 Funaki et al. ................. 257/202
(Continued)

FOREIGN PATENT DOCUMENTS

JP 8-88356 4/1996
(Continued)

OTHER PUBLICATIONS

Japanese Office Action, with English translation, issued in Japanese Patent Application No. JP 2001-356279, mailed Jan. 9, 2008.

*Primary Examiner* — Zandra Smith
*Assistant Examiner* — Tsz K Chiu
(74) *Attorney, Agent, or Firm* — McDermott Will & Emery LLP

(57) ABSTRACT

It is an object of the invention to effectively absorb a power noise and to implement the stable operation of a circuit.

The invention provides a semiconductor device comprising a bypass capacitor including an MOS structure having a gate electrode formed to be extended from a power wiring region to a portion provided under an empty region which is adjacent to the power wiring region and has no other functional layer, and formed through a capacitive insulating film on a diffusion region having one conductivity type, and a substrate contact formed under a ground wiring region and fixing a substrate potential, wherein the bypass capacitor has a contact to come in contact with the power wiring which is formed on a surface of the gate electrode and has the diffusion region having the one conductivity type and a diffusion region of the substrate contact connected to each other.

6 Claims, 20 Drawing Sheets

U.S. PATENT DOCUMENTS

| | | | |
|---|---|---|---|
| 6,204,542 B1 * | 3/2001 | Kinoshita et al. | 257/401 |
| 6,434,730 B1 * | 8/2002 | Ito et al. | 716/8 |
| 7,307,333 B2 * | 12/2007 | Itoh et al. | 257/532 |
| 2003/0011007 A1 * | 1/2003 | Takashino | 257/202 |
| 2003/0185068 A1 * | 10/2003 | Saito et al. | 365/200 |

FOREIGN PATENT DOCUMENTS

| | | |
|---|---|---|
| JP | 11-31819 A | 2/1999 |
| JP | 2000-208634 A | 7/2000 |
| JP | 2000208634 A * | 7/2000 |
| JP | 2001-189420 | 7/2001 |

* cited by examiner

| | | |
|---|---|---|
| ▢ ▨ | | 1. POWER WIRING |
| ▨ | | 2. WIRING CROSSOVER THROUGH HOLE |
| ▨ | | 3. PATTERN IN WHICH OBSTACLE IS REMOVED FROM POWER WIRING |
| ☐ | | 4. SUBSTRATE |
| ▨ ▨ | | 5. GROUND WIRING |
| ▨ | | 6. DIFFUSION FOR SUBSTRATE CONTACT |
| ■ | | 7. THROUGH HOLE FOR SUBSTRATE CONTACT |
| ▥ | | 8. BASIC CELL |
| ☐ | | 9. BYPASS CAPACITOR FRAME |
| ▨ | | 3d. ADDITIONAL ARRANGEMENT REGION PATTERN |

CROSS-SECTION A

CROSS-SECTION B

CROSS-SECTION A

CROSS-SECTION B

CROSS-SECTION A

CROSS-SECTION B

CAPACITY IS REDUCED DUE TO ELECTRIC CHARGE TAKEN IN/OUT ON THE SUBSTRATE TERMINAL SIDE OF DEPLETION LAYER AT HIGH FREQUENCY

FIG. 11 (b) CROSS-SECTION A
FIG. 11 (c) CROSS-SECTION B

CROSS-SECTION A

CROSS-SECTION B

▨ 70: DIFFUSION

▨ 71: POLYSILICON

■ 72: THROUGH HOLE

SEMICONDUCTOR DEVICE, METHOD OF GENERATING PATTERN FOR SEMICONDUCTOR DEVICE, METHOD OF MANUFACTURING SEMICONDUCTOR DEVICE, AND APPARATUS FOR GENERATING PATTERN FOR SEMICONDUCTOR DEVICE

RELATED APPLICATION

This application is a divisional of Ser. No. 10/496,297, filed May 21, 2004, now U.S. Pat. No. 7,307,333, which is a §371 of PCT/JP2002/12184, filed Nov. 21, 2002, claims priority of Japanese Patent application No. 2001-356279, filed November 21, 2001, the contents of which are herewith incorporated by reference.

TECHNICAL FIELD

The present invention relates to a semiconductor device, a method of generating a semiconductor device, a method of manufacturing a semiconductor device and an apparatus for generating a semiconductor device, and more particularly to a semiconductor device including a bypass capacitor and an inductor for a countermeasure against a noise of the semiconductor device, and a method of generating a pattern thereof.

BACKGROUND ART

As a matter of course, the utilization scope of an LSI in a computer has been enlarged for communicating apparatuses such as a portable telephone, general household appliances, toys and cars. On the other hand, however, there are problems in that an electromagnetic interference (EMI) generated from these products causes the radio interference of a receiver such as a television or a radio and the malfunction of other systems. A countermeasure in the whole products such as filtering or shielding has also been taken against these problems. In respect of an increase in the number of components, an increase in a cost and the difficulty of a countermeasure in a product, the noise suppression of an LSI package has been greatly demanded.

In such a situation, the LSI of each product is placed as a key device and an increase in the scale and speed of the LSI has been demanded in order to maintain the competitiveness of the product. In order to meet these demands in a reduction in a product cycle, it is necessary to automate an LSI design. There has been increased a necessity for employing a synchronous design as the condition of the introduction of a design automation technique under the existing circumstances. If all circuits are operated synchronously with a reference clock and the LSI has a large scale and a high speed, an instantaneous current is very increased. Consequently, an increase in the electromagnetic interference is caused.

With the microfabrication of the LSI and an increase in the speed of an operating frequency, thus, countermeasures against latch up and a noise have been great problems.

In a method of designing a cell base, generally, a diffusion region and a through hole are formed in a substrate cell as the countermeasure against latch up. Consequently, a contact is formed and a substrate or a well is fixed to have a supply potential through the contact.

If a substrate contact is added into the substrate cell as the countermeasure against latch up, however, a chip area is increased.

The inventors have proposed a method of enhancing a latch up breakdown voltage, reducing a noise radiation and reducing a malfunction caused by a noise entering from the outside while suppressing an increase in the area of a semiconductor device by providing a substrate contact under a power wiring and arranging a capacitor having a cell bypassed between the power wiring and a ground wiring in order to prevent an increase in a chip area (JP-A-2000-208634).

The method serves to automatically generate the pattern of a semiconductor device, comprising the steps of generating a layout including a cell having an MIS structure on a semiconductor substrate and the pattern of a power wiring and a ground wiring, generating a layout including a cell having an MIS structure on the semiconductor substrate and the patterns of a power wiring and a ground wiring, and automatically generating the pattern of a bypass capacitor having the MIS structure constituted by the semiconductor substrate, a capacitive insulating film and an electrode to overlap with the pattern of the power wiring.

According to this method, the power wiring pattern has already been formed before the formation of the bypass capacitor including a diffusion layer and a through hole. Therefore, the bypass capacitor can be formed by utilizing the power wiring pattern so that a high integrated semiconductor device can easily be formed.

As a specific example, FIG. 20 shows an example of the bypass capacitor, in which the bypass capacitor is formed between a polysilicon electrode (gate electrode) 71 and a substrate, and a capacitive insulating film (a gate insulating film which is not shown) provided therebetween, and a diffusion region is formed to take the shape of a ring in a region corresponding to the outer periphery of a gate electrode, a virtual power wiring pattern in a transverse direction and a virtual power wiring pattern in a vertical direction are extracted in place of an original power wiring pattern by using a kind of bypass capacitor array in which an electric potential on the substrate side is fetched and connected in the diffusion region, and a bypass capacitor frame 70 including them is formed. Moreover, a through hole 72 is formed on the surface of the polysilicon electrode 71 in order to fetch an electric potential on the polysilicon electrode side. Consequently, the pattern of a semiconductor device provided with a bypass capacitor having the ring-shaped polysilicon electrode 71 under a power wiring is generated.

According to this method, it is possible to reduce a power noise which becomes more serious with the microfabrication of a semiconductor device and an increase in the speed of an operating frequency. However, the effect of reducing the power noise cannot be fully produced. Moreover, portions in which a decoupling capacity is to be inserted are decreased with an increase in the integration of the semiconductor device. Thus, there is a problem in that a sufficient decoupling capacity cannot be obtained.

Furthermore, it is necessary to take a pattern direction and a wiring direction into consideration in the addition of a capacity. In a conventional pattern generating method, consequently, automation is hard to perform.

Therefore, it has been demanded that a bypass capacitor having a larger capacity is formed without an increase in an occupied area in order to reduce a power noise more reliably.

In the method, moreover, the operating frequency is not taken into consideration. In a semiconductor device to be driven at a specific operating frequency, the effect of reducing a power noise cannot be sufficiently obtained.

Thus, the use of the bypass capacitor comprising polysilicon constituting a gate electrode, a bypass capacitor diffusion provided to take the shape of a ring on the outside of the polysilicon, and a bypass capacitor contact provided on the polysilicon cannot take a countermeasure for absorbing a power noise for each frequency characteristic.

Although a capacitor having a large capacity may be provided in an ESD and a wiring between blocks and a capacitor having a small capacity may be provided between the blocks in the same chip, moreover, the same noise countermeasure is entirely taken and is not always effective.

The invention has been made in consideration of the actual circumstances and has an object to effectively absorb a power noise and to implement the stable operation of a circuit.

It is another object of the invention to easily automate pattern generation in order to reliably reduce a power noise.

It is yet another object of the invention to form a capacitor having a larger capacity without increasing an occupied area in order to reduce a power noise more reliably.

It is a further object of the invention to implement the stable operation of a circuit by properly using a capacity to absorb a power noise depending on an operating frequency characteristic.

DISCLOSURE OF THE INVENTION

In order to attain the object, a semiconductor device according to the invention serves to search for an empty region on a layout pattern, increase a bypass capacitor capacity by forming a capacitor in the empty region, change the shape of a bypass capacitor, insert an inductance cell and properly use the bypass capacitor depending on an operating frequency characteristic.

More specifically, the invention provides a semiconductor device comprising a bypass capacitor including an MOS structure having a gate electrode formed to be extended from a power wiring region to a portion provided under an empty region which is adjacent to the power wiring region and has no other functional layer, and formed through a capacitive insulating film on a diffusion region having one conductivity type, and a substrate contact formed under a ground wiring region and fixing a substrate potential, wherein the bypass capacitor has a contact to come in contact with the power wiring which is formed on a surface of the gate electrode and includes the diffusion region having the one conductivity type and a diffusion region of the substrate contact connected to each other.

According to such a structure, a diffusion region is formed to be extended under the empty region. Consequently, it is possible to form the capacitor by utilizing the empty region without increasing a chip area with a simple structure. Thus, a noise can be reduced. In the generation of a pattern, the layout pattern of a chip is generated and an adjacent empty region to a region in which a decoupling capacity can be generated under the power wiring (a place in which other layers are not present at all) is then searched automatically by utilizing a graphic logical operation and a resize processing, and the region thus searched is utilized as a decoupling capacity arrangement region. Thus, a pattern can be generated automatically and a noise can be reduced with high precision.

Moreover, a wiring layer to be a connecting destination can also be formed as a pattern. Thus, a noise can be reduced with higher precision. At this time, it is necessary to carry out the arrangement to observe a design rule. Consequently, it is possible to form a reliable pattern with higher precision.

More specifically, all regions opposed to a diffusion region and a gate electrode formed thereon act as a capacitor so that an area can be utilized very effectively. Moreover, an electric potential on the substrate side is also fetched through the diffusion region. Therefore, the pattern can be integrally formed over a large area because of a low resistance for fetching an electric potential.

According to such a structure, moreover, a capacitor having a large capacity can be connected between the power wiring and the ground wiring through a diffusion layer having a low resistance.

Accordingly, it is possible to provide a semiconductor device having a great function of reducing an electromagnetic interference noise by a high-frequency operation. Furthermore, if a contact is independently formed on a gate electrode to change the electric potentials of the gate electrode and the power wiring provided thereon, furthermore, it is also possible to form a capacity between the gate electrode and the power wiring. Thus, a capacitor having a two-layer structure can be formed so that a capacity can be increased.

It is desirable that the bypass capacitor should be constituted by a plurality of unit cells and the unit cells are arranged in a matrix in the empty region.

According to such a structure, the units are arranged. Consequently, it is possible to easily carry out an operation and to readily form a pattern at a high speed.

It is desirable that the diffusion region having the one conductivity type should have the same conductivity type as that of the diffusion region of the substrate contact.

According to such a structure, a connection to the substrate contact can easily be carried out and a connecting resistance can be reduced.

It is desirable that the diffusion region having the one conductivity type should be different from a conductivity type of the diffusion region of the substrate contact, and the substrate contact and the diffusion region having the first conductivity type should be connected to each other through a silicide layer formed on a surface of the diffusion region of the substrate contact.

According to such a structure, there is a problem in that a region having a small number of carriers is formed on an interface because of a reverse conductivity type and a connecting resistance is thus increased if the connection is to be carried out at the diffusion layer in the connecting portion to the substrate contact. By siliciding, the diffusion region provided under the gate electrode is connected through the silicide layer provided on the surface of the diffusion region. Consequently, the connecting resistance can be improved so that an excellent bypass capacitor can be obtained.

Moreover, there is a problem in that a region having a small number of carriers is formed on an interface and the connecting resistance is thus increased because of a reverse conductivity type if the connection is to be carried out at the diffusion layer in the connecting portion to the substrate contact. By siliciding, the diffusion region provided under the gate electrode is connected through the silicide layer provided on the surface of the diffusion region. Consequently, the connecting resistance can be improved so that an excellent bypass capacitor can be obtained.

It is desirable that the diffusion region of the substrate contact should be constituted by a first diffusion region to be an extended region of a diffusion region having the same conductivity type as that of the diffusion region having the one conductivity type and a second diffusion region having a different conductivity type from that of the diffusion region having the one conductivity type, and the first and second diffusion regions should be connected to a ground wiring through the substrate contact and constitute a decoupling capacity having an MOS transistor structure, respectively.

According to such a structure, the capacitor having the MOS transistor structure can be formed so that the capacity can be increased. Actually, a region in which the decoupling capacity can be arranged is extracted in the pattern generation, and the overlapping portion of the substrate contact region and the connecting diffusion layer is separated to carry out a connection to the wiring when the connecting diffusion layer is to be provided. These steps can automatically be carried out by a graphic logical operation and a resize processing.

When the decoupling capacity is to be actually used, there is no problem in a low frequency region of 10 to 100 Hz in an MOS diode structure. In a high frequency band, an electric charge is taken in/out on the substrate terminal side of a depletion layer. Consequently, there is a problem in that a capacity is reduced. By forming the decoupling capacity having the MOS transistor structure, therefore, it is possible to obtain a capacity which is approximately five times as much as that in the conventional art.

It is desirable that the bypass capacitor should include a capacitor region having a diffusion region having one conductivity type and a square gate electrode formed integrally with a surface of the diffusion region having the one conductivity type through a capacitive insulating film, and a diffusion region to surround an outer periphery of the capacitor region, and a diffusion region of a substrate contact should be connected through the diffusion region and a power wiring to be an upper layer should be connected to a surface of the gate electrode through a plurality of contacts.

According to such a structure, in addition to the advantages, there is provided the diffusion region on the outer periphery of the capacity region. Consequently, it is possible to connect a connecting diffusion region in every direction irrespective of a direction in which a power wiring is extended. Consequently, the degree of freedom of a layout can also be increased. Furthermore, a square shape is taken. Therefore, an array can freely be obtained. In case of a multi-array, the arrangement can be carried out efficiently and the degree of freedom of the array can also be increased.

The invention provides a semiconductor device comprising a first bypass capacitor including an MOS structure formed under a power wiring region and having a first gate electrode formed on a first diffusion region having a first conductivity type through a capacitive insulating film so as to be connected to a power wiring, the first gate electrode being connected to a necessary diffusion potential for forming a transistor capacity of the bypass capacitor on the ground wiring side, and a second bypass capacitor including an MOS structure formed under a ground wiring region and having a second gate electrode formed on a second diffusion region having a different conductivity type from that of the first diffusion region through a capacitive insulating film so as to be connected to a ground wiring, the second gate electrode being connected to a necessary diffusion potential for forming a transistor capacity of the bypass capacitor on the power wiring side.

According to such a structure, the bypass capacitor to be a capacitive element is constituted on both the power supply side and the ground side. Consequently, a bypass capacitor having a large capacity can be obtained in a very small area.

It is desirable that the power wiring should be extended toward the ground wiring side at an edge on the ground wiring side and should be connected to the second diffusion region, and the ground wiring should be extended toward the power wiring side at an edge on the power wiring side and should be connected to the first diffusion region.

According to such a structure, the connection can be achieved by only a change in a wiring pattern. Thus, manufacture can easily be carried out.

It is desirable that the power wiring and the ground wiring should be mutually protruded to take a shape of a comb-tooth on a boundary thereof.

According to such a structure, in addition to the advantages, a pattern having a close packed structure can be formed.

It is desirable that the first and second diffusion regions should be mutually protruded to take a shape of a comb-tooth on a boundary between the power wiring side and the ground wiring side.

According to such a structure, in addition to the advantages, a region to be a connecting space is eliminated and a direct connection can be carried out. Consequently, an area efficiency can be enhanced considerably.

It is desirable that the first gate electrode of the first bypass capacitor should have a wiring extended from the ground wiring side to the power wiring side at an edge on the ground wiring side and should be connected to the second diffusion region, and the second gate electrode of the second bypass capacitor should have a wiring extended from the power wiring side to the ground wiring side at an edge on the power wiring side and should be connected to the first diffusion region.

It is desirable that the first and second gate electrodes should be mutually protruded to take a shape of a comb-tooth on a boundary between the power wiring side and the ground wiring side.

According to such a structure, it is sufficient that the pattern of the gate electrode should be only changed, and the formation can easily be carried out. By causing a gate electrode structure on the lower layer side to be more complicated than the power wiring or the ground wiring, moreover, it is also possible to improve precision in a pattern, easily form a pattern and enhance a yield.

It is desirable that at least one of the first bypass capacitor and the second bypass capacitor should have the first or second gate electrode provided with an opening portion for forming a contact region, and a contact of the first or second diffusion region should be formed through the opening portion.

According to such a structure, the gate electrode is formed to be doughnut-shaped and the contact reaching the diffusion region is formed on a hole in a central part. Consequently, the degree of freedom is increased in a connecting direction so that the degree of freedom of a pattern layout can be increased.

It is desirable that a connection of the first gate electrode and the second diffusion region and a connection of the second gate electrode and the first diffusion region should be carried out through a joint cell unit.

According to such a structure, the connection can be achieved without changing the bypass capacitor region by using the joint cell unit. Consequently, the degree of freedom can be increased in a connecting direction and the degree of freedom of a pattern layout can be increased.

In addition, the pattern can easily be arranged automatically.

Moreover, the invention is characterized in that the bypass capacitor comprises a capacitor region including a diffusion region having one conductivity type and a gate electrode formed on a surface of the diffusion region having the one conductivity type through a capacitive insulating film and having an opening portion for forming a contact region, and a diffusion contact to come in contact with the diffusion region through the opening portion, and the gate electrode and the diffusion region are connected to have different electric potentials.

According to such a structure, the opening portion for forming a contact region is provided on the gate electrode. By coming in contact with the diffusion region through the opening portion, the gate electrode and the diffusion region can be connected to have different electric potentials. For example, the formation can be carried out in any of adjacent regions to the power wiring and the ground wiring. Thus, the decoupling capacity can be added by utilizing an empty region.

It is desirable that the bypass capacitor should be generated in a minimum graphic dimension of a wiring pattern rule for manufacturing a semiconductor.

According to such a structure, a pattern design can automatically be carried out.

It is desirable that a plurality of bypass capacitors should be present in an array under the power wiring.

According to such a structure, a capacitor having a large capacity can be formed more efficiently.

Moreover, it is desirable that the bypass capacitor should comprise capacitive insulating films which are different from each other and should be formed in such a manner that a capacity per unit area is varied in a chip.

In consideration of the specifications, the situation of the region is decided from a design rule and bypass capacitors having different characteristics are projected to be provided for each region. In general, a high breakdown voltage is required for a countermeasure against a surge in the outer peripheral portion of a chip which is close to a power supply, while the high breakdown voltage is not particularly required in an inner part. For this reason, the thickness of a gate insulating film is increased in the vicinity of the outer periphery of the chip and is reduced in the inner part. Alternatively, it is necessary to employ a method in which a gate insulating film having a multilayer structure is formed in only the vicinity of the outer periphery of the chip in some cases.

Moreover, a frequency characteristic is important in the vicinity of a functional element. While a bypass capacitor having a large capacity is to be formed for a high frequency, a bypass capacitor having a small capacity is enough for a low frequency.

Therefore, it is also possible to set a distance in an inner direction from a chip frame based on process information and to cut and divide an outer peripheral portion and an inner part by a logical operation and a resize processing, thereby arranging bypass capacitors having different specifications from each other. In consideration of the specifications, thus, the situation of a region is decided from the design rule to provide bypass capacitors having different characteristics for the regions. Consequently, it is possible to provide a semiconductor device having a more excellent characteristic and a high reliability.

Furthermore, the invention provides a semiconductor device comprising a capacitor region including a diffusion region having one conductivity type and a gate electrode formed on a surface of the diffusion region having the one conductivity type through a capacitive insulating film and having an opening portion for forming a contact region, the diffusion region being connected to have a different electric potential from that of the gate electrode through a diffusion contact to come in contact with the diffusion region through the opening portion.

According to such a structure, a contact is made with the diffusion region of the substrate through the opening portion provided on the gate electrode. Therefore, the structure can be applied in every wiring direction. Thus, the degree of freedom of a wiring can be increased and a layout can be obtained very easily.

Moreover, the invention provides a semiconductor device comprising a first pattern including a first rod pattern constituted by a lower wiring formed on a surface of the semiconductor device and having first and second lower pads on both ends, and third and fourth upper pads formed in opposite positions to each other through an interlayer insulating film on the first and second lower pads, connected to the first and second lower pads through a contact hole and constituted by an upper wiring in such a manner that each pad is positioned in an almost square corner portion, a second pattern including a second rod pattern constituted by an upper wiring formed on the lower wiring through an interlayer insulating film, having third and fourth upper pads on both ends and formed opposite in an orthogonal direction to the first rod pattern, and first and second lower pads formed in opposite positions to each other through an interlayer insulating film on the third and fourth upper pads, connected to the third and fourth upper pads through a contact hole and constituted by a lower wiring in such a manner that each pad is positioned in an almost square corner portion, and a capacitor unit pattern constituted to connect one of the pads of each of the first and second patterns to have a different electric potential.

According to such a structure, when the exact arrangement is carried out without depending on the vertical and transverse directions of a power wiring, a capacitor can be formed well even if a connection is carried out in any direction. Thus, the degree of freedom can be obtained over a layout and a semiconductor device capable of easily forming a pattern can be obtained. By utilizing an upper wiring and a lower wiring, moreover, a capacity can be formed three-dimensionally, that is, in a vertical direction, a transverse direction and an oblique direction. Thus, it is possible to obtain a large decoupling capacity in a very small area.

It is desirable that the first and second rod patterns should have almost the same widths and lengths, and the first pattern and the second pattern should be constituted to almost overlap with each other.

According to such a structure, all overlapping regions in the vertical direction, the transverse direction and the oblique direction become capacities. By utilizing the very small area at a maximum, therefore, it is possible to obtain a large decoupling capacity.

Moreover, it is desirable that edges of the pads for layers which are positioned so as not to vertically overlap with each other should be protruded from sides of the square and constitute a connecting region, and a shift region between the patterns should be formed point symmetrically in such a manner that only one connecting region is protruded from each of the first pattern and the second pattern on each of the sides.

According to such a structure, only a connecting region is exactly superposed on the wiring pattern. Consequently, the layout can easily be carried out and a reliability can be enhanced.

Furthermore, it is desirable that at least one of the sides of the square should be formed along an edge of a metal wiring and should be electrically connected to the metal wiring through one of the pads.

According to such a structure, only the connecting region is exactly superposed on the wiring pattern of the metal wiring. Consequently, the layout can easily be carried out and a reliability can be enhanced.

It is desirable that at least one of the sides of the square should be formed along an edge of a metal wiring and capacitor unit patterns in plural lines should be provided in such a manner that the side is electrically connected to the metal wiring through one of the pads.

According to such a structure, the capacitor unit patterns in plural lines are provided. Therefore, a necessary capacity can be added efficiently. Moreover, the degree of freedom of a layout can be increased and a semiconductor device having a high reliability can easily be obtained.

The invention provides a method comprising a layout pattern forming step of designing and arranging a layout pattern of a semiconductor chip, an empty region detecting step of detecting an empty region in which the layout pattern is not present, a wiring adjacent region detecting step of detecting an adjacent region to a wiring region, a logical operation step of carrying out a logical operation over a region detected at the empty region detecting step and a wiring region detected at the wiring adjacent region detecting step, and a capacity arranging step of setting a region extracted at the logical operation step to be a decoupling capacity additional arrangement region, wherein a decoupling capacity is additionally arranged in the empty region.

According to such a method, the empty region is detected and the bypass capacitor is additionally provided in the empty region. Therefore, automatic formation can easily be carried out and a pattern layout can readily be performed efficiently.

It is desirable that the capacity arranging step should include a bypass capacitor frame generating step of arranging a bypass capacitor frame on a whole surface of a chip in order to automatically provide a formation pattern of a bypass capacitor to be a decoupling capacity, a bypass capacitor arranging logical operation step of calculating a logical product of a region provided under a power wiring of the layout pattern and a decoupling capacity additional arrangement region and the bypass capacitor frame, a bypass capacitor arrangement resizing step of carrying out scale-down/up over operation data on the logical product of the region provided under the power wiring and decoupling capacity additional arrangement region and the bypass capacitor frame, thereby causing a very small pattern to disappear, and a connecting diffusion layer logical operation step and a connecting diffusion layer resizing step of generating a diffusion to connect the bypass capacitor region diffusion of the region provided under the power wiring and the decoupling capacity additional arrangement region and a substrate contact region diffusion under a ground wiring.

According to such a structure, the pattern of the power wiring has already been generated prior to the generation of the pattern of the bypass capacitor. Consequently, it is possible to automatically generate the pattern of the bypass capacitor included in the pattern of the power wiring. More specifically, a semiconductor device having a high integration and a small power noise can be formed based on a pattern provided automatically.

It is desirable that the bypass capacitor arrangement resizing step should serve to provide a bypass capacitor and to increase or reduce a numeric value of a half of an interval between the bypass capacitors to regulate data for forming a gate electrode, thereby increasing and decreasing a capacitance value.

According to such a structure, pattern data can easily be obtained efficiently. As data for forming a gate electrode, for example, polysilicon data, metal electrode data or metal silicide data are used.

It is desirable that a method of manufacturing a semiconductor device using the method of generating the pattern of a semiconductor device should further comprise a step of forming a semiconductor device and a bypass capacitor based on the formation pattern of a bypass capacitor thus obtained.

According to such a structure, it is possible to automatically form a semiconductor device.

Moreover, the invention provides an apparatus for generating a pattern for a semiconductor device, comprising layout pattern forming means for designing and arranging a layout pattern of a semiconductor chip, empty region detecting means for detecting an empty region in which the layout pattern is not present, wiring adjacent region detecting means for detecting an adjacent region to a wiring region, logical operation means for carrying out a logical operation over a region detected by the empty region detecting means and a wiring region detected by the wiring adjacent region detecting means, and capacity arranging means for setting a region extracted by the logical operation means to be a decoupling capacity additional arrangement region, wherein a decoupling capacity is additionally arranged in the empty region.

According to such a structure, it is possible to automatically form a semiconductor device.

Figure 1:
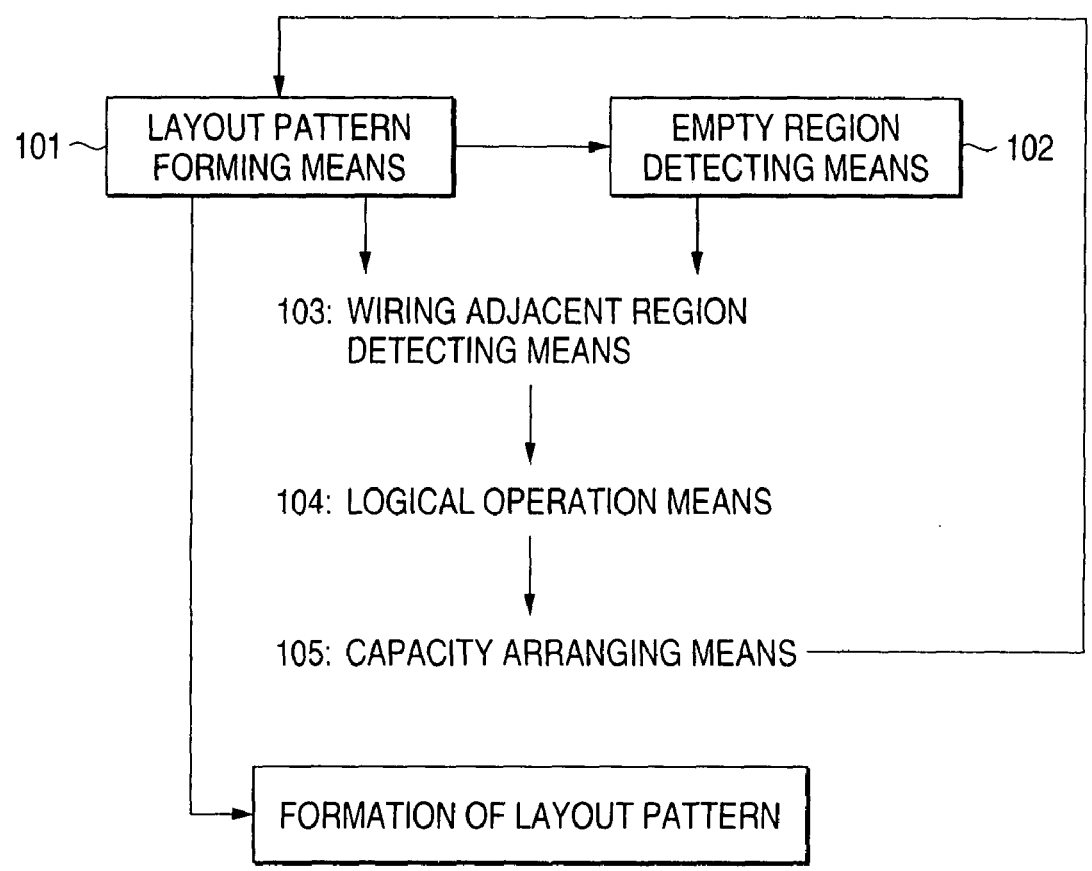
FIG. 1 is a block diagram showing a pattern generating apparatus according to a first embodiment of the invention.

In the drawings, 101 denotes layout pattern forming means, 102 denotes empty region detecting means, 103 denotes wiring adjacent region detecting means, 104 denotes logical operation means, and 105 denotes capacity arranging means.

BEST MODE OF CARRYING OUT THE INVENTION

An embodiment of the invention will be described below in detail with reference to the drawings.

First Embodiment

FIG. 1 is a block diagram showing a pattern generating apparatus according to an embodiment of the invention. The apparatus comprises layout pattern forming means 101 for designing and arranging the layout pattern of a semiconductor chip, empty region detecting means 102 for detecting an empty region in which the layout pattern is not present on the semiconductor chip, wiring adjacent region detecting means 103 for detecting an adjacent region to a wiring region from the layout pattern formed by the layout pattern forming means, logical operation means 104 for carrying out a logical operation over a region detected by the empty region detecting means and a wiring region detected by the wiring adjacent region detecting means, and capacity arranging means 105 for setting a region extracted by the logical operation means to be a decoupling capacity additional arrangement region, and has such a structure that a decoupling capacity is additionally provided in the empty region and layout pattern data subjected to a capacity addition again are output from the layout pattern forming means 101.

Figure 2:
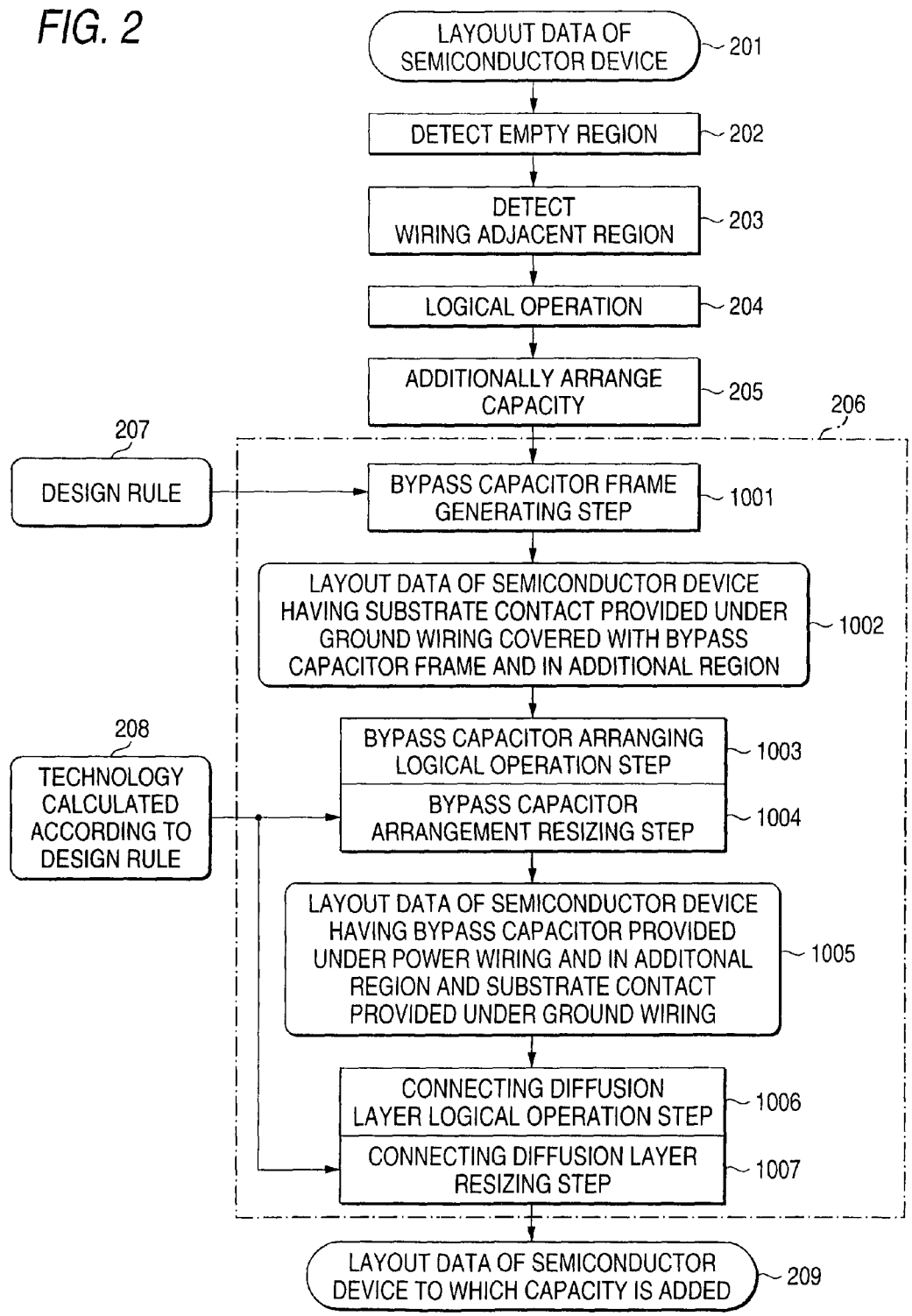
FIG. 2 is a flowchart showing the details of a bypass capacitor pattern generating procedure according to the first embodiment of the invention together.

More specifically, the pattern generating apparatus forms a layout pattern subjected to the capacity addition as shown in FIG. 2. First of all, the layout pattern of a semiconductor device comprising a bypass capacitor pattern having an MIS structure constituted by a semiconductor substrate, a capacitive insulating film and an electrode is generated from layout data 201 of the semiconductor device. Furthermore, an empty region in which the layout pattern is not present on a semiconductor chip is detected from the layout data (Step 202). Then, an adjacent region to a wiring region is detected from a layout pattern formed by the layout pattern forming means (Step 203). Moreover, the region detected by the empty region detecting means and the wiring region detected by the wiring adjacent region detecting means are subjected to a logical operation (Step 204) and a decoupling capacity additional arrangement region is obtained (Step 205).

From data of a semiconductor device having the decoupling capacity additional arrangement region thus obtained and provided with a substrate contact under a ground wiring, a diffusion layer frame forming a bypass capacitor is provided based on a design rule 207 at a graphic pattern generating step 206, and furthermore, a semiconductor pattern is formed according to a technology calculated based on the design rule to carry out a logical operation and a resize processing so that the layout data of a semiconductor device in which a bypass capacitor is present under a power wiring and in an additional region and a substrate contact is present under a ground wiring, and they are connected through a diffusion are obtained (209).

At the graphic pattern generating step 206, as will be described below, a bypass capacitor frame is formed based on a design rule 1004 from layout data 1001 of a semiconductor device in which a substrate contact is present under a power wiring and in an additional arrangement region and a logical operation and a resizing step for arranging a bypass capacitor are executed according to a technology 1005 calculated based on the design rule, and furthermore, the layout data of the semiconductor device having a bypass capacitor provided additionally under the power wiring are generated, and a logical operation and resizing for a connecting diffusion layer are carried out so that layout data 1003 of the semiconductor device in which the bypass capacitor and the substrate contact are connected to each other through a diffusion layer can be obtained automatically.

More specifically, at the graphic pattern generating step, the layout data 1005 of the semiconductor device in which the bypass capacitor is provided under the power wiring and the substrate contact is provided under the ground wiring are obtained through a bypass capacitor frame generating step 1001 of automatically forming a bypass capacitor frame over a whole surface based on the design rule 207 from the layout data of the semiconductor device in which the substrate contact is present under the ground wiring and in the additional arrangement region (the output data of the step 205), a bypass capacitor arranging logical operation step 1003 of carrying out a logical operation over the covering bypass capacitor frame and a synthetic region (a synthetic region of the ground wiring and the additional arrangement region), and a bypass capacitor arrangement resizing step 1004 of carrying out a resize to have an optimum size based on the technology 105 calculated according to the design rule, and furthermore, there are provided a connecting diffusion layer logical operation step 1006 of automatically arranging a connecting diffusion layer from the layout data and carrying out a logical operation and a connecting diffusion layer resizing step 1007 of carrying out a resize to cause the connecting diffusion layer to have an optimum size based on a technology 208 calculated according to the design rule.

The technology calculated according to the design rule implies the size of a component such as a cell, a bypass capacitor or a wiring which is defined by the design rule of each process such as a diffusion, sputtering or etching.

First of all, the layout pattern of the semiconductor device having the substrate contact under the ground wiring and in the additional region (the output of the Step 205) and the design rule 207 are input to the bypass capacitor frame generating step 1001 and the semiconductor device 1002 covered with the bypass capacitor frame is output from the bypass capacitor frame generating step 1001. At the bypass capacitor frame generating step 1001, a chip size is measured and the number of arrays which can be provided therein is calculated in accordance with the design rule 207, and furthermore, the bypass capacitor frame in the same array is provided on the semiconductor device having the substrate contact under the ground wiring and in the additional region so that the semiconductor device covered with the bypass capacitor frame and having the substrate contact under the ground wiring and in the additional region is output.

Next, the semiconductor device covered with the bypass capacitor frame and having the substrate contact under the ground wiring and in the additional region and the technology 208 calculated in accordance with the design rule are input to the bypass capacitor arranging logical operation step 1003 and the bypass capacitor arrangement resizing step 1004, and the layout data 1005 of the semiconductor device having the bypass capacitor under the power wiring and in the additional region and having the substrate contact under the ground wiring respectively are output from the bypass capacitor arranging logical operation step 1003 and the bypass capacitor arrangement resizing step 1004. At the bypass capacitor arranging logical operation step 1003 and the bypass capacitor arrangement resizing step 1004, a product of a region provided under the power wiring and the additional region and a bypass capacitor array is logically calculated and the data are scaled down and up to cause a very small pattern to disappear. The bypass capacitor generation is calculated in the same region in accordance with the technology 105 obtained according to the design rule, and the semiconductor device 1005 having the bypass capacitor under the power wiring and in the additional region and having the substrate contact under the ground wiring respectively is output.

Subsequently, the semiconductor device 1005 having the bypass capacitor under the power wiring and the substrate contact under the ground wiring and in the additional region and the technology 208 calculated in accordance with the design rule are input to the connecting diffusion layer logical operation step 1006 and the connecting diffusion layer resizing step 1007, and a semiconductor device having the bypass capacitor under the power wiring and in the additional region and the substrate contact under the ground wiring respectively which are connected through a diffusion is output from the connecting diffusion layer logical operation step 1006 and the connecting diffusion layer resizing step 1007. At the connecting diffusion layer logical operation step 1006 and the connecting diffusion layer resizing step 1007, the generation of a diffusion region for connecting a bypass capacitor region diffusion under the power wiring and a substrate contact region diffusion under the ground wiring is calculated in accordance with the technology 208 obtained according to the design rule, and a semiconductor device having the bypass capacitor under the power wiring and the substrate contact under the ground wiring in which the bypass capacitor and the ground wiring are connected to each other in the diffusion region is output. By using the layout pattern of the semiconductor device, a semiconductor device is actually formed.

Figure 3:
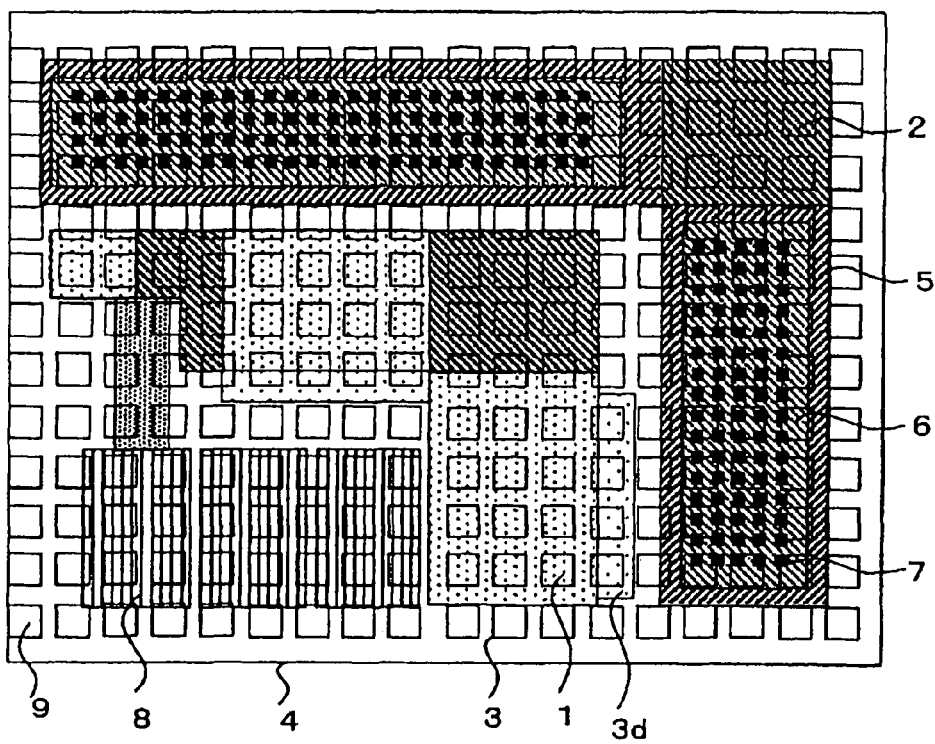
FIG. 3 is a plan view showing the chip of a semiconductor device according to the first embodiment of the invention and is a plan view in which a bypass capacitor frame is generated over the whole surface of the chip.

FIG. 3 is a plan view showing a part of an LSI chip at a graphic pattern generating step according to the embodiment of the invention and a plan view in which a bypass capacitor frame is generated over a whole surface. The semiconductor device 1002 covered with the bypass capacitor film 9 and the technology 207 calculated in accordance with the design rule are input to the bypass capacitor arranging logical operation step 1003 and the bypass capacitor arrangement resizing step 1004. A wiring crossover through hole 2 for a line connection is removed from a power wiring 1 of the semiconductor device 1002 covered with the bypass capacitor frame at the bypass capacitor arranging logical operation step 1003 so that a graphic pattern 3 in which an obstacle is removed from the power wiring and an additional arrangement region pattern 3d are generated.

Figure 4:
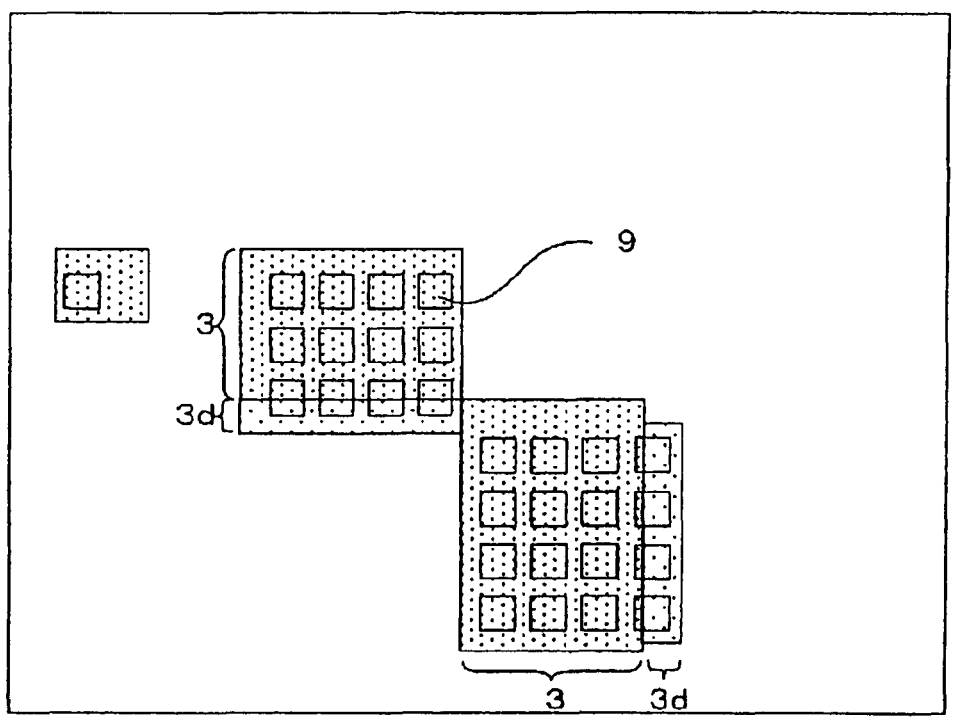
FIG. 4 is a plan view showing a graphic pattern in which an obstacle is removed from a power wiring and a bypass capacitor frame.

FIG. 4 is a plan view showing the execution of a logical operation of a product of a logical sum of the graphic pattern 3 in which the obstacle is removed from the power wiring in the previous item and the additional arrangement region pattern 3d and the bypass capacitor frame 9.

Furthermore, a half value of the minimum width of the bypass capacitor frame taking the logical expression of the product is defined into the technology 208 and a graphic pattern which becomes very small at the bypass capacitor arrangement resizing step 1004 by scale-down/up is erased.

Figure 5:
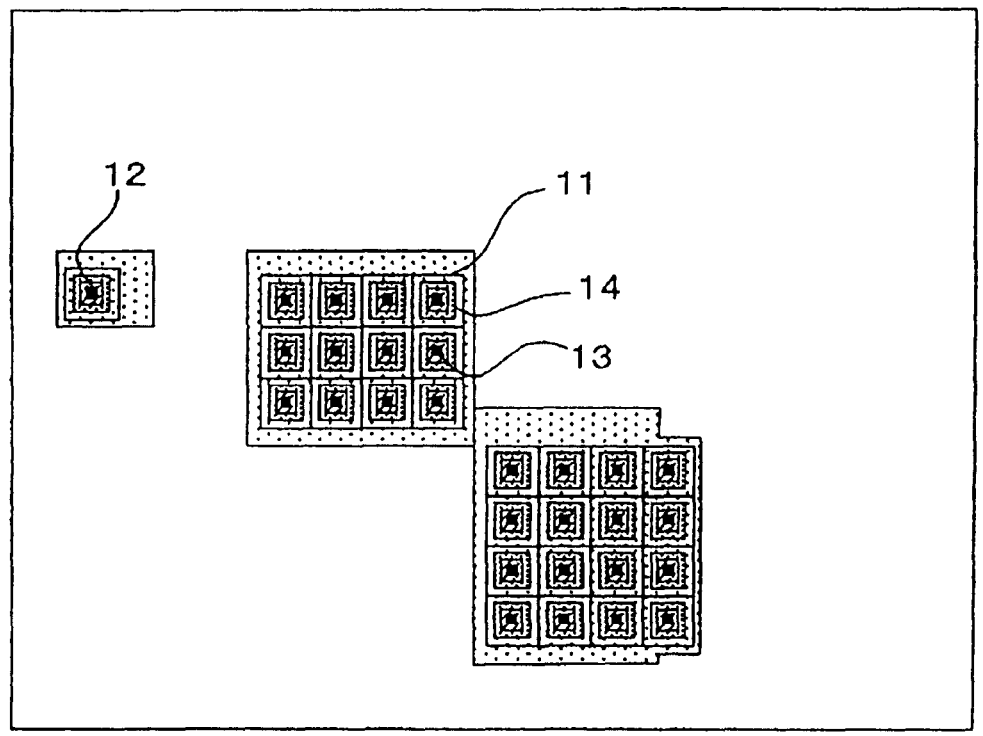
FIG. 5 is a plan view in which the bypass capacitor frame is used to generate a bypass capacitor.

FIG. 5 is a plan view in which the bypass capacitor frame 9 in the previous item is used to generate a bypass capacitor. A half numeric value of an interval between the bypass capacitor frames is defined into the technology 208 from the bypass capacitor frame and diffusion data 11 are generated by the execution of scale-up/down. A value corresponding to a certain numeric value is defined into the technology 208 from the bypass capacitor frame and polysilicon data 12 are generated by the execution of the scale-down. The value of the certain numeric value is defined into the technology 208 from the generated polysilicon and a through hole 13 is generated by the execution of the scale-down.

Figure 6:
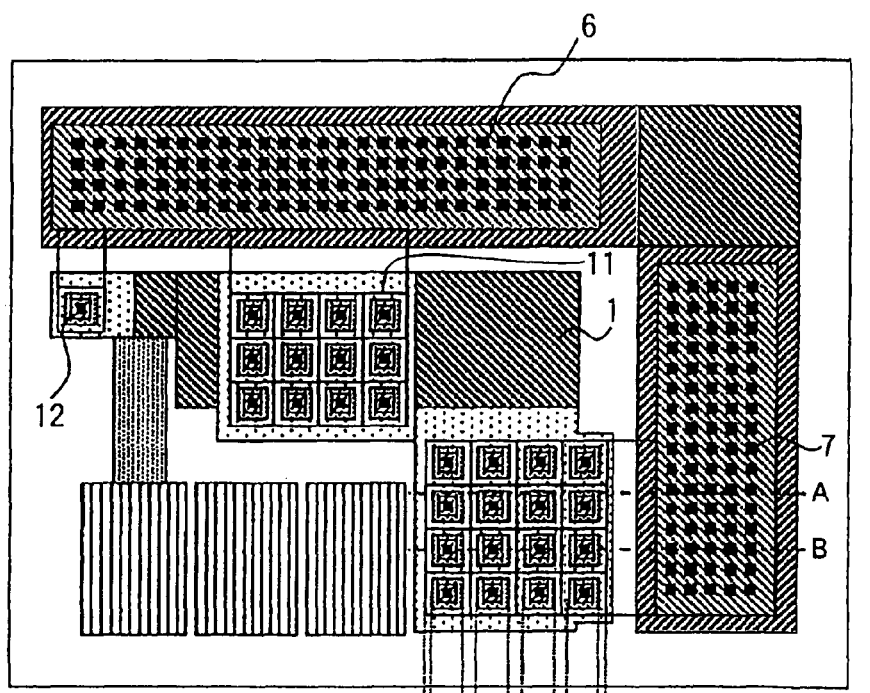
FIG. 6 is a view in which an MOS transistor having a different polarity from the polarity of a substrate is automatically provided as a bypass capacitor under a power wiring according to the first embodiment of the invention.
Figure 6:
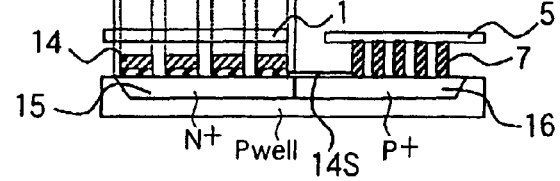
Figure 6:
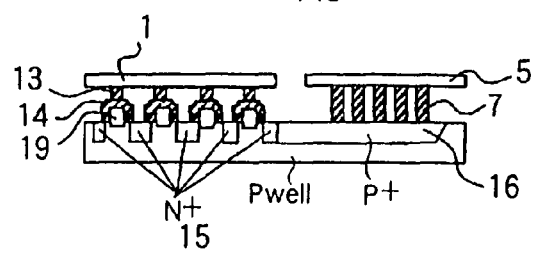

Thus, there is formed a layout pattern of a semiconductor device shown in FIG. 6 which comprises a second bypass capacitor including a second ring-shaped polysilicon electrode 12 which is individually surrounded by a diffusion region 11, and a first bypass capacitor including a square gate electrode 14 formed on an $N^+$ diffusion layer 15 provided on the surface of a substrate through a gate insulating film 14g and a power wiring 1 covering the gate electrode via a large number of through holes 13 formed in an array. The first and second polysilicon electrodes 14 and 12 are formed to be connected to the power wiring 1 via the through hole 13 provided thereon respectively.

In the first bypass capacitor, thus, all regions opposed to the $N^+$ diffusion layer 15 extended to an empty region and the gate electrode 14 formed thereon act as a capacitor and an area can be utilized very effectively.

Furthermore, a capacitor having a large area can also be formed between the gate electrode 14 and the power wiring 1. Therefore, a capacitor having a two-layer structure can be formed so that a capacity can be increased.

According to such a structure, moreover, a capacitor having a large capacity can be connected through a diffusion layer having a low resistance between a power wiring and a ground wiring. Accordingly, it is possible to provide a semiconductor device having a great function of reducing an electromagnetic interference noise by a high-frequency operation.

With the structure of the first bypass capacitor, thus, a gate area can be more increased than that in case of a gate electrode which takes the shape of a ring or a rectangle having a diffusion region on both sides. Consequently, a capacitor area can be increased considerably.

By using a new shape of a bypass capacitor in which the shape of an electrode is changed, thus, a capacitance value can be more increased than that of the second bypass capacitor.

In the case in which a plurality of bypass capacitor frames are provided in a bypass capacitor region formed under the power wiring, a half numeric value of the interval between the polysilicons is defined into the technology 208 and polysilicon data 14 are generated by the execution of scale-up/down. Such a polysilicon shape causes a gate area to be further increased so that the capacitance value is increased.

FIGS. 6(a) to 6(c) are plan views (FIGS. 6(b) and 6(c) are A-A and B-B sectional views of FIG. 6(a) respectively) in which a bypass capacitor having an MOS structure using a substrate contact under the ground wiring 5 and a diffusion region having a different conductivity type from that of a substrate under the power wiring 1 extended to an additional formation region in a graphic pattern according to the embodiment of the invention is automatically arranged as a bypass capacitor and the substrate contact provided under the ground wiring and the bypass capacitor provided under the power wiring are connected through a diffusion. The polarity of a diffusion region 15 for forming a bypass capacitor is reverse to that of a diffusion 16 for the substrate contact. By forming a metal silicide layer 14S on the diffusion region surface 16 through a silicide process, however, it is possible to connect the diffusion region 15 of the bypass capacitor to the diffusion region 16 for the substrate contact with a low resistance. The bypass capacitor frames are isolated from each other through an isolating film 19 formed by an LOCOS method.

According to the embodiment, the bypass capacitor is automatically provided under the power wiring 1. Consequently, it is possible to provide a capacitance value for reducing a power noise without increasing the area of a chip. Furthermore, the diffusion region 15 for bypass capacitor formation which is provided under the power wiring 5 and the diffusion region 16 for substrate contact formation which is constituted under the ground wiring are connected to each other. Consequently, the power wiring and the bypass capacitor, and the ground wiring 5 and the bypass capacitor can be connected to each other with a lower resistance than that of the substrate having a high resistance.

The metal silicide layer 14S can also be formed at the same step as a step of siliciding other regions prior to the formation of a gate insulating film. When a polysilicon layer constituting the gate electrode of the bypass capacitor is to be silicided, moreover, the gate insulating film is also patterned simultaneously with the patterning of the polysilicon and a metal layer is formed and silicided, and a portion which is not silicided, that is, the metal layer on the side surface of the gate insulating film is removed by selective etching. Consequently, a silicide layer can be formed on the surface of the substrate excluding a portion provided under the gate electrode. Also in this case, a current can be fetched without a PN junction and an excellent bypass capacitor can be obtained.

Second Embodiment

While the description has been given to the example in which the bypass capacitor having the MOS structure using the diffusion region having a reverse conductivity type to that of the substrate. (P well) is formed under the power wiring region extended to the empty region and is connected through a salicide process, a bypass capacitor having an MOS structure using a diffusion region having the same conductivity type as that of a substrate (P well) is automatically arranged as a bypass capacitor and a substrate contact provided under a ground wiring and the bypass capacitor provided under a power wiring are connected to each other through a diffusion in this example.

Figure 7:
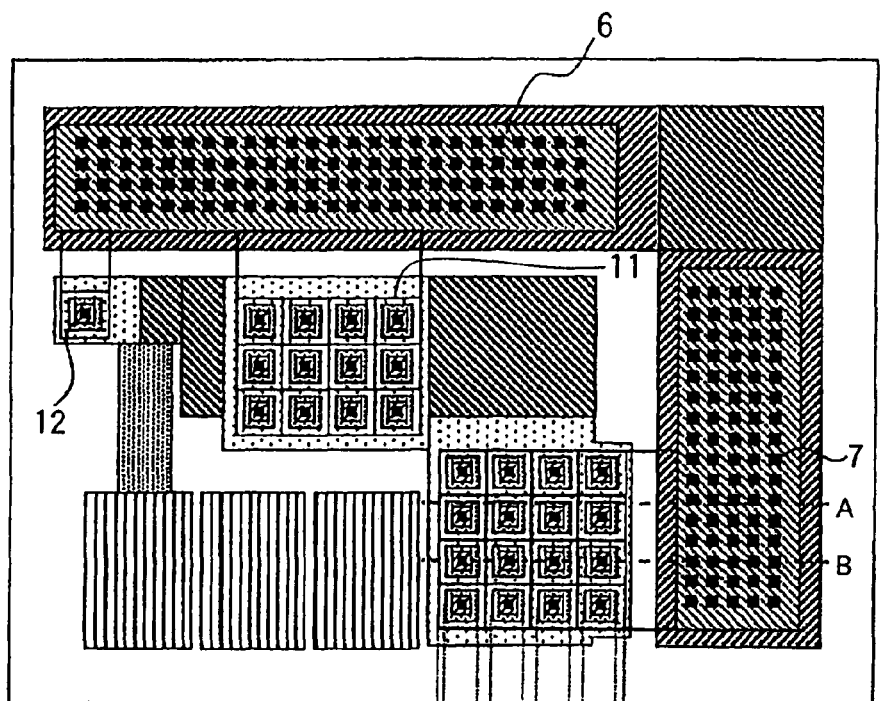
FIG. 7 is a view in which an MOS transistor having the same polarity as the polarity of the substrate is automatically provided as a bypass capacitor under a power wiring according to a second embodiment of the invention.
Figure 7:
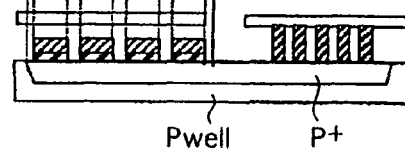
Figure 7:
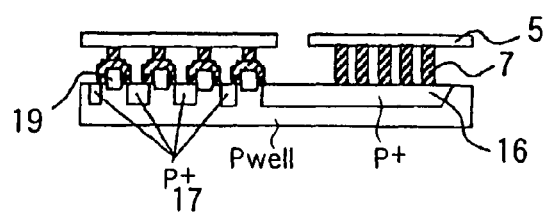

More specifically, FIGS. 7($a$) to 7($c$) are plan views (FIGS. 7($b$) and 7($c$) are A-A and B-B sectional views of FIG. 7($a$) respectively) in which a bypass capacitor having an MOS structure using a substrate contact under a ground wiring and a diffusion region having the same conductivity type as that of a substrate under a power wiring are automatically arranged as a bypass capacitor in a graphic pattern according to the embodiment of the invention, and the substrate contact provided under the ground wiring and the bypass capacitor provided under the power wiring are connected to each other through a diffusion.

According to the embodiment, the bypass capacitor is automatically arranged under the power wiring extended to an empty region so that a capacitance value for reducing a power noise can be provided without increasing the area of a chip. Furthermore, a substrate contact formation diffusion 16 constituted under a ground wiring 5 is extended and is connected to a bypass capacitor formation diffusion 15 provided under a power wiring 1. Consequently, the power wiring and the bypass capacitor, and the ground wiring 5 and the bypass capacitor can be connected to each other with a lower resistance as compared with the substrate having a high resistance.

FIGS. 7($a$) to 7($c$) are plan views in which a bypass capacitor having an MOS structure using a substrate contact under the ground wiring 5 and a diffusion region having the same conductivity type as that of a substrate under the power wiring 1 extended to an additional formation region are automatically arranged as a bypass capacitor in a graphic pattern according to the embodiment of the invention, and the substrate contact provided under the ground wiring and the bypass capacitor provided under the power wiring are connected to each other through a diffusion. A diffusion region 17 for bypass capacitor formation and a diffusion 16 for a substrate contact have the same polarity and are formed integrally with each other.

Third Embodiment

Figure 8:
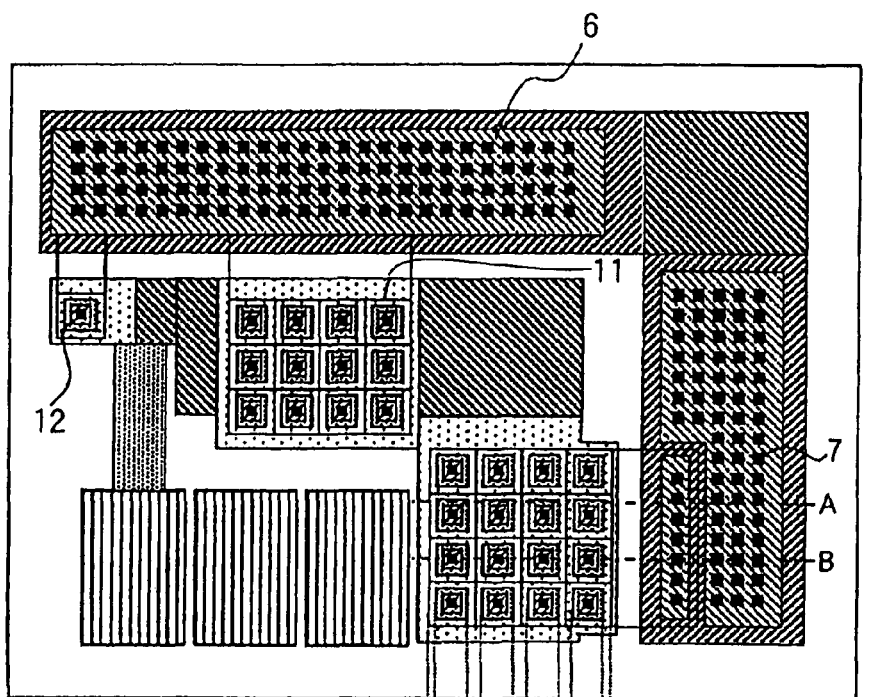
FIG. 8 is a view in which an MOS transistor according to a third embodiment of the invention is automatically provided as a bypass capacitor.
Figure 8:
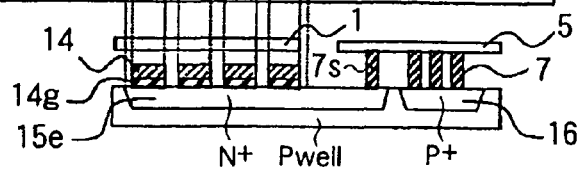
Figure 8:
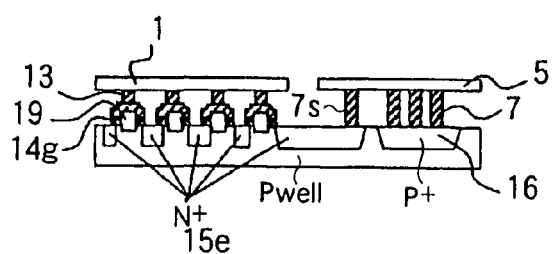

While the description has been given to the example in which the bypass capacitor having the MOS structure using the diffusion region having a reverse conductivity type to that of the substrate (P well) is formed under the power wiring region extended to the empty region and is connected through the salicide process in the first embodiment, an $N^+$ type diffusion region 15$e$ (a diffusion region having a different conductivity type from that of a substrate (P well)) extended for bypass capacitor formation is further extended to a part of a substrate contact formation region and both a substrate contact 7 provided in contact with a contact diffusion region 16 under a ground wiring 5 and a connecting contact 7$s$ provided in contact with the extended $N^+$ type diffusion region 15$e$ are connected to the ground wiring 5 in a substrate contact region as shown in FIGS. 8($a$) to 8($c$) (FIGS. 8($b$) and 8($c$) are A-A and B-B sectional views of FIG. 8($a$) respectively) in this example.

Other portions are formed in the same manner as those in the first embodiment.

According to such a structure, a bypass capacitor having an MOS transistor structure is formed. The function of a capacity in an FM frequency band is approximately five times as great as that of the MOS diode structure, for example, the structure according to the first embodiment, and it is possible to form a capacitor having a larger capacity in a very small area.

Actually, a region in which a decoupling capacity can be arranged is extracted in pattern generation and the overlapping portion of a substrate contact region and a connecting diffusion layer is isolated and a connection to a wiring is carried out when the connecting diffusion layer is to be provided. These steps can be automatically executed by a graphic logical operation and a resize processing in the same manner as in the first embodiment.

Figure 9:
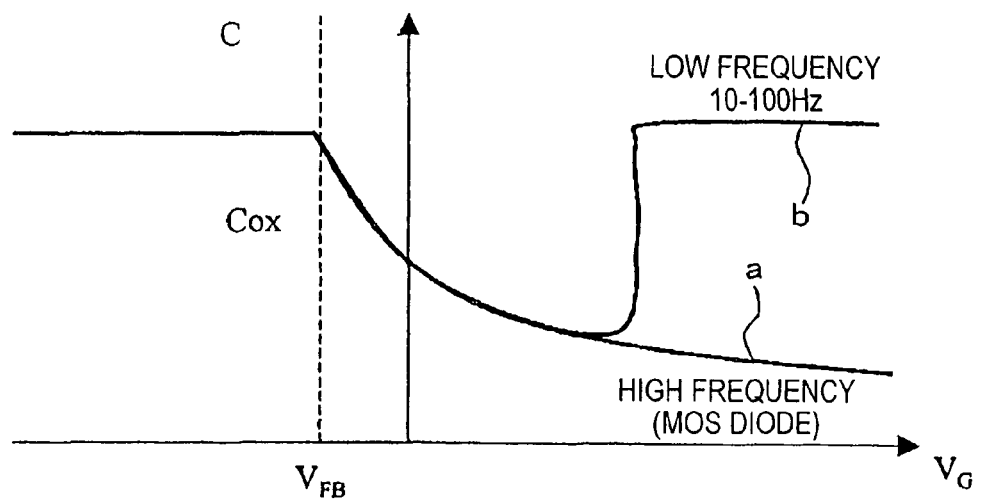
FIG. 9 is an explanatory chart showing the advantage of the third embodiment of the invention.

When the decoupling capacity is to be actually used, there is a problem in that a desirable capacity can be obtained in a low frequency region of 10 to 100 Hz as shown in a capacity—voltage curve of a curve b and an electric charge is taken in/out on the substrate terminal side of a depletion layer in a high frequency band so that a capacity is reduced as shown in a curve of a in a bypass capacitor having an MOS diode structure as shown in an explanatory chart of FIG. 9. On the other hand, a decoupling capacity having an MOS transistor structure shown in FIG. 8 is formed. Consequently, it is possible to obtain a capacity which is approximately five times as large as that in the conventional art. More specifically, a depletion layer is expanded over a junction surface in a non-salicide structure. An electric charge is stored in the vicinity of a channel at a low frequency. Therefore, a distance from the electric charge stored in a gate terminal is small and a distance between the capacity and the electric charge is inversely proportional. Therefore, the capacity can be maintained to be large. However, the electric charge spreads to the outside of the depletion layer at a high frequency and a distance from the electric charge of a gate capacity is increased so that the capacity is reduced. The reason is that a long time is taken to form an inverted layer as a physical phenomenon so that the capacity can follow a change in a voltage at a low frequency and cannot follow a quick change in a voltage at a high frequency. Thus, it is impossible to obtain the advantages of the capacity. By using the structure according to the invention, automatic generation can be carried out, and an electric potential in the vicinity of a channel can be fixed and an electric charge can be stored in the vicinity of the channel. Therefore, the capacity can be maintained to be large in a high frequency band.

Fourth Embodiment

In the third embodiment, the $N^+$ type diffusion region 15e (the diffusion region having a different conductivity type from that of a substrate (P well)) extended for forming the bypass capacitor is further extended to a part of the substrate contact formation region under the power wiring region extended to an empty region, and both the substrate contact 7 provided in contact with the contact diffusion region 16 under the ground wiring 5 and the connecting contact 7s provided in contact with the extended $N^+$ type diffusion region 15e are connected to the ground wiring 5 in the substrate contact region so that a bypass capacitor cell is formed under the power wiring.

Figure 10:
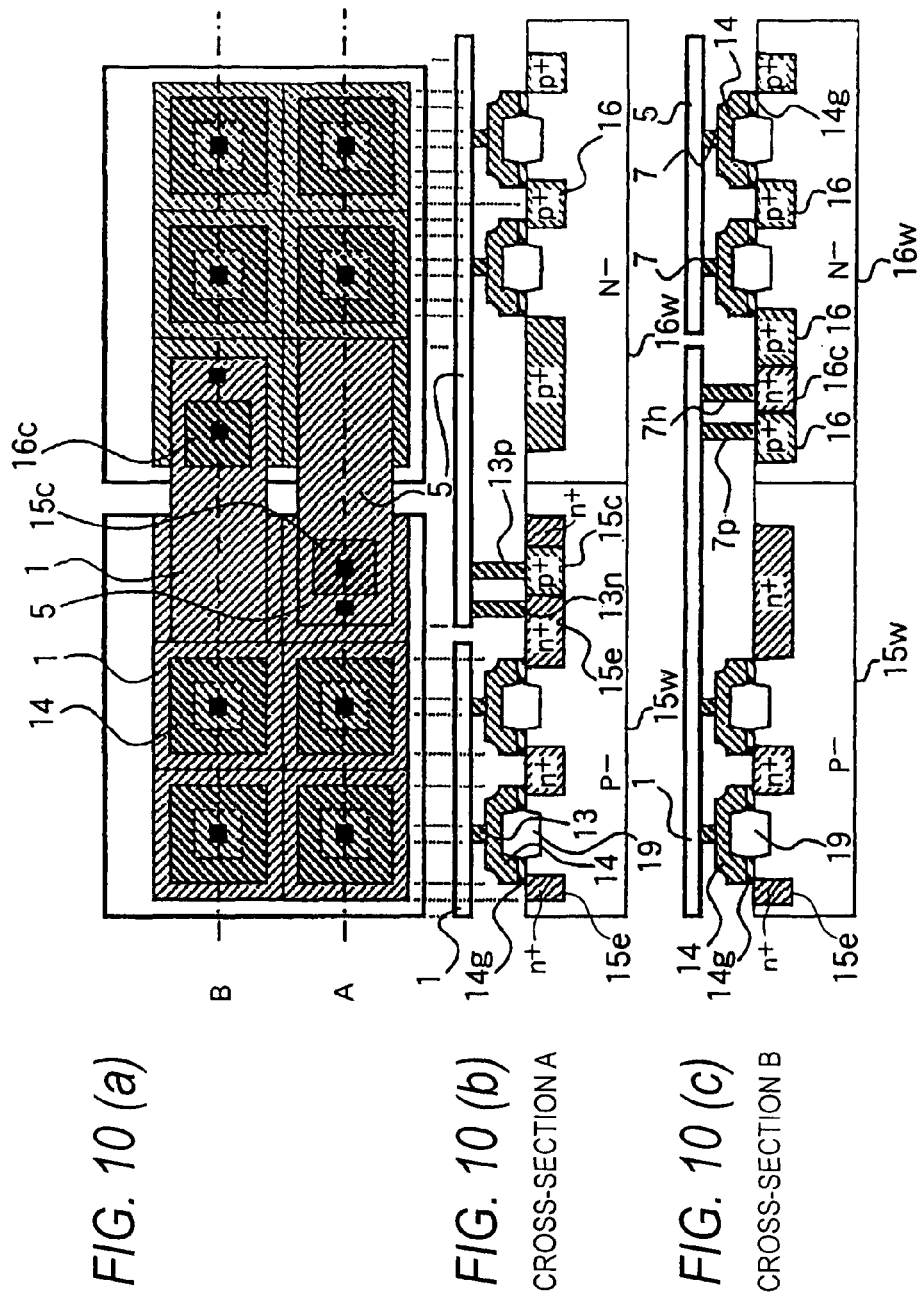
FIG. 10 is a view showing a fourth embodiment of the invention.

On the other hand, in this example, a bypass capacitor cell is formed under both a power wiring and a ground wiring, a wiring is extended from the power wiring side to the ground wiring side and is connected to a necessary diffusion potential for forming a transistor capacity on the power supply side, and furthermore, a wiring is extended from the ground wiring side to the power wiring side and is connected to a necessary diffusion potential for forming a transistor capacity on the ground wiring side as shown in FIGS. 10(a) to 10(c) (FIGS. 10(b) and 10(c) are A-A and B-B sectional views of FIG. 10(a) respectively) in order to generate a capacity in both the power wiring and the ground wiring.

For a layout, a contact region is provided like a comb-tooth. A wiring for extension can be constituted by a metal wiring such as a gold wiring or a polysilicon wiring.

A region provided under a power wiring is formed in a p well 15w and a region provided under a ground wiring is formed in an n well 16w.

The bypass capacitor cell on the power wiring side is constituted by an $n^+$ diffusion layer 15e formed in the p well 15w and a gate electrode 14 comprising a polysilicon layer formed through a gate insulating film 14g.

On the other hand, the bypass capacitor cell on the ground wiring side is constituted by a $p^+$ diffusion layer 16 formed in the n well 16w and the gate electrode 14 comprising the polysilicon layer formed through the gate insulating film 14g.

In the bypass capacitor cell on the power wiring side, the $p^+$ diffusion region 16 formed in the n well 16w on the ground wiring side and an $n^+$ diffusion region 16c formed to penetrate through the n well 16w in the $p^+$ diffusion region 16 are connected to have the same potential through contacts 7p and 7n by the extension of an electrode wiring 1, respectively.

On the other hand, in the bypass capacitor cell on the ground wiring side, the $n^+$ diffusion region 15e formed in the p well 15w on the power wiring side and the $p^+$ diffusion region 15c formed to penetrate through the p well 15w in the $n^+$ diffusion region 15e are connected to have the same potential through contacts 13n and 13p by the extension of a ground wiring 5, respectively.

By such a structure, a capacitive element is constituted on the power supply side and the ground side. Thus, it is possible to obtain a bypass capacitor having a large capacity in a very small area.

Fifth Embodiment

In the fourth embodiment, the description has been given to the structure in which the capacitive element is constituted on the power supply side and the ground side and the bypass capacitor having a large capacity is obtained in the very small area. While the p well 15w and the n well 16w are formed under the power wiring and the ground wiring respectively in the embodiment, a cell region actually becomes an empty region for a connection every line in the connection.

Figure 11:
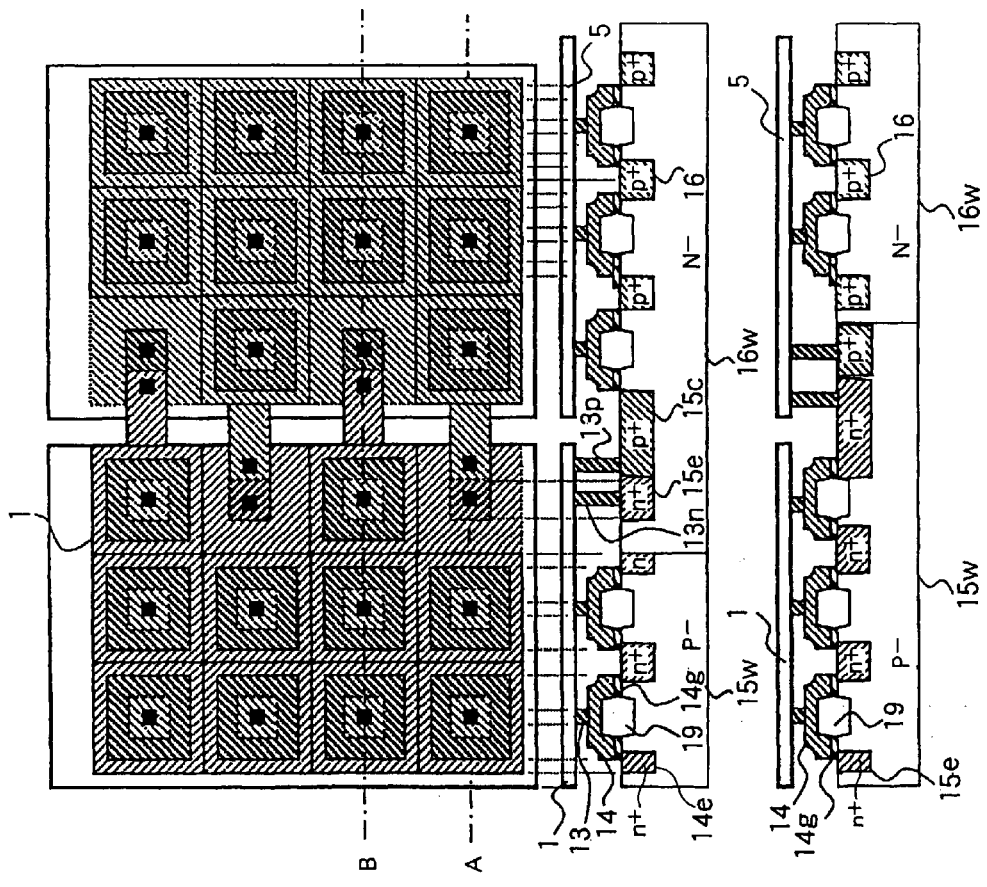
FIG. 11 is a view showing a fifth embodiment of the invention.

This example is characterized in that the p well 15w and the n well 16w are alternately bulged like a comb-tooth to have a close packed structure as shown in FIGS. 11(a) to 11(c) (FIGS. 11(b) and 11(c) are A-A and B-B sectional views of FIG. 11(a) respectively).

Consequently, a cell region required for the connection is reduced so that a capacity can be increased.

The same portions have the same designations.

Sixth Embodiment

In the fourth embodiment, the description has been given to the structure in which the capacitive element is constituted on the power supply side and the ground side and the bypass capacitor having a large capacity is obtained in the very small area. While the p well 15w and the n well 16w are formed under the power wiring and the ground wiring respectively in the embodiment, a cell region actually becomes an empty region for a connection every line in the connection.

Figure 12:
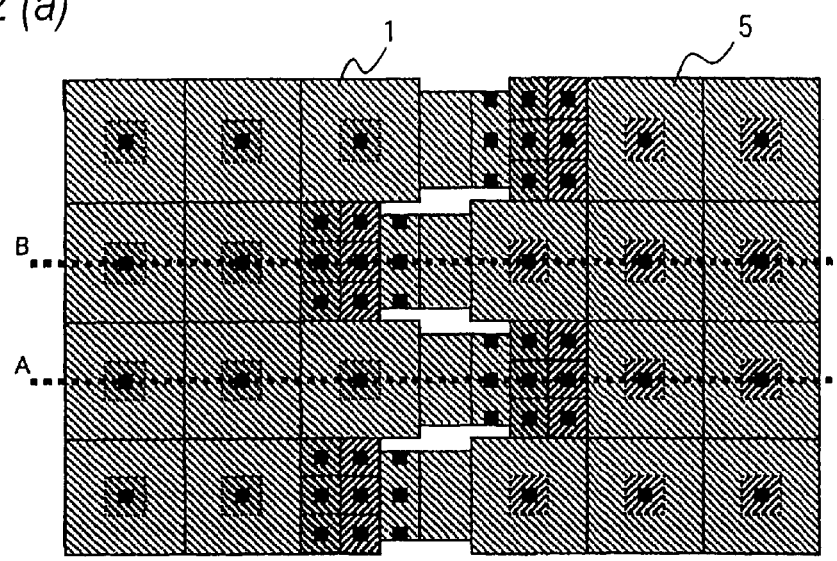
FIG. 12 is a view showing a sixth embodiment of the invention.
Figure 12:
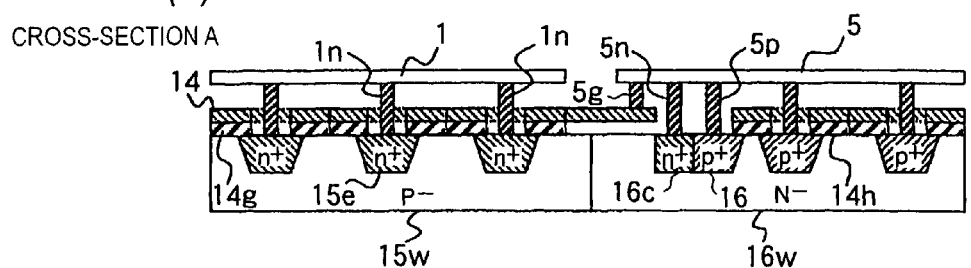
Figure 12:
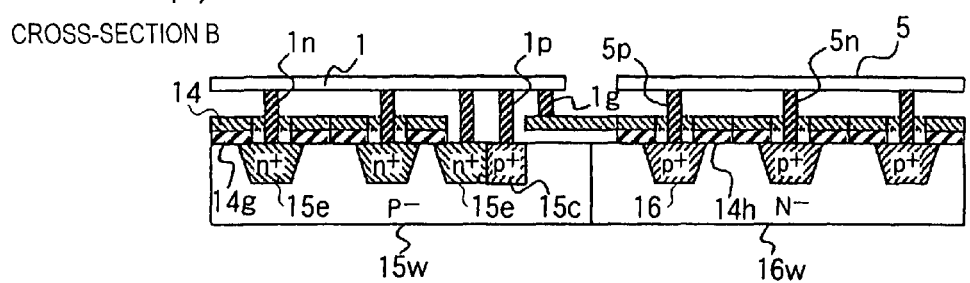

This example is characterized in that an electric potential on the substrate potential side of the bypass capacitor is fetched through an opening portion 14h formed in a gate electrode 14 as shown in FIG. 12 in order to reduce the empty region.

More specifically, in this example, a bypass capacitor cell is formed under both a power wiring and a ground wiring and the gate electrode of each bypass capacitor cell is extended from the power wiring side to the ground wiring side and is connected to a power wiring 5 through a contact 5g, and furthermore, is extended from the ground wiring side to the power wiring side and is connected to the ground wiring 5 through a contact 1g as shown in FIGS. 12(a) to 12(c) (FIGS. 12(b) and 12(c) are A-A and B-B sectional views of FIG. 12(a) respectively) in order to generate a capacity in both the power wiring and the ground wiring.

For a layout, the gate electrode wiring 14 is extended like a comb-tooth and is thus arranged.

In the same manner as in the embodiments, a region provided under the power wiring is formed in the p well 15w, and furthermore, a region provided under the ground wiring is formed in the n well 16w.

The bypass capacitor cell on the power wiring side is constituted by an $n^+$ diffusion layer 15e formed in the p well 15w and the gate electrode 14 comprising a polysilicon layer formed through a gate insulating film 14g. In each bypass capacitor cell, the $n^+$ diffusion layer 15e can be fetched through an opening portion 14h formed on the gate electrode 14.

On the other hand, the bypass capacitor cell on the ground wiring side is constituted by a $p^+$ diffusion layer 16 formed in the n well 16w and the gate electrode 14 comprising a polysilicon layer formed through the gate insulating film 14g. In each bypass capacitor cell, the p+diffusion layer 16 can be fetched through the opening portion 14h formed on the gate electrode 14.

The gate electrode 14 of the bypass capacitor cell on the power wiring side connects the p+ diffusion region 16 formed in the n well 16w on the ground wiring side by the extension of the gate electrode 14 itself to the ground wiring side and an n+ diffusion region 16c formed to penetrate through the n well 16w in the p+ diffusion region 16 through contacts 5n and 5p by the extension of an electrode wiring 1 via the opening portion 14h formed on the gate electrode 14 from the ground wiring 5 to have the same electric potential, respectively.

On the other hand, the gate electrode 14 of the bypass capacitor cell on the ground wiring side connects the n+ diffusion region 15e formed in the p well 15w by the extension of the gate electrode itself to the power wiring side and a p+ diffusion region 15c formed to penetrate through the p well 15w in the n+ diffusion region 15e through contacts 1n and 1p via the opening portion 14h formed on the gate electrode 14 from the power wiring 1 to have the same electric potential, respectively. The connection is carried out to have the same electric potential through contacts 13n and 13p by the extension of the ground wiring 5, respectively.

By such a structure, a capacitive element is constituted on the power supply side and the ground side. Thus, it is possible to obtain a bypass capacitor having a large capacity in a very small area.

In the embodiment, the opening portion for forming a contact region is provided on the gate electrode and a contact is made with the diffusion region through the opening portion so that the gate electrode and the diffusion region can be connected to have different electric potentials. For example, the formation can be carried out in any adjacent region to wirings having different electric potentials such as a power wiring and a ground wiring. Thus, it is possible to add a decoupling capacity by utilizing an empty region.

Seventh Embodiment

Figure 13:
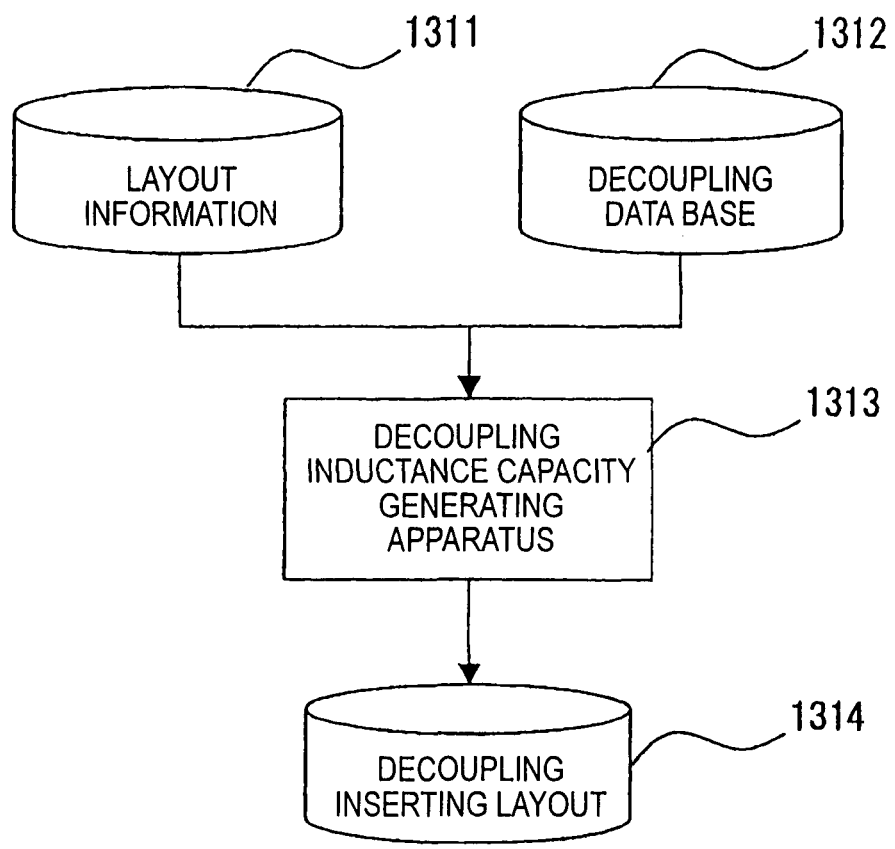
FIG. 13 is a diagram showing a seventh embodiment of the invention.

In the first to third embodiments, the description has been given to the example in which the bypass capacitor is formed under the power wiring region extended to the empty region. In the fourth to sixth embodiments, the description has been given to the example in which the bypass capacitor is formed under the power wiring region and in the ground wiring region. In this example, as shown in FIG. 13, a vertical structure pattern to be formed additionally is changed into a data base and a layout inserting a decoupling capacity is formed from the data base. More specifically, a decoupling insertion layout 1314 is obtained from layout information 1311 and a decoupling data base 1312 through a decoupling inductance capacity generating layer value 1313.

Figure 14:
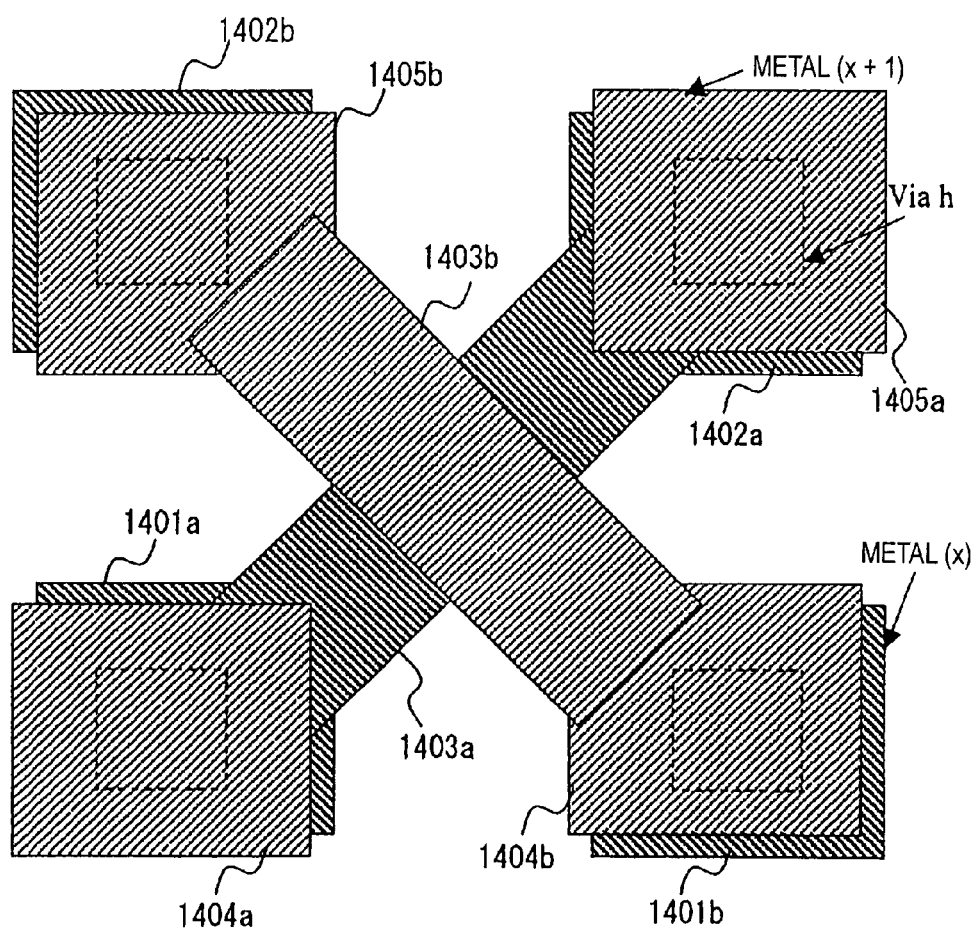
FIG. 14 is a view showing the seventh embodiment of the invention.

Various capacitor cell units are stored in the decoupling capacity data base as shown in FIG. 14, for example, and can be utilized depending on necessary conditions.

The capacitor cell unit is constituted by a first pattern A comprising a first rod pattern 1403a, constituted by a lower wiring formed on the surface of a semiconductor device and having first and second lower pads 1401a and 1402a on both ends and third and fourth upper pads 1404a and 1405a formed in opposite positions through an interlayer insulating film 2000 (see, FIG. 17) respectively, connected to the first and second lower pads 1401a and 1402a through a contact hole h and constituted by an upper wiring to have each pad positioned in an almost square corner portion, and a second pattern B comprising a second rod pattern 1403b constituted by an upper wiring formed on the lower wiring through an interlayer insulating film, having third and fourth upper pads 1404b and 1405b on both ends and formed opposite in an orthogonal direction to the first rod pattern and first and second lower pads 1401b and 1402b formed in positions opposite to the third and fourth upper pads 1404b and 1405b through an interlayer insulating film 2000 respectively, connected to the third and fourth upper pads 1404b and 1405b through the contact hole h and constituted by a lower wiring having each pad positioned in an almost square corner portion, and one of the pads of each of the first and second patterns A and B is connected to have a different electric potential.

The first and second rod patterns A and B have almost the same widths and lengths, and the first pattern and the second pattern are constituted to almost overlap with each other. The edge of each of the pads positioned so as not to vertically overlap with each other for each layer on each side of a square is protruded from each side and constitutes a connecting region. A shift region between the patterns is formed point symmetrically with each other in such a manner that only one connecting region is protruded from the first pattern and the second pattern on each side, respectively.

Figure 15:
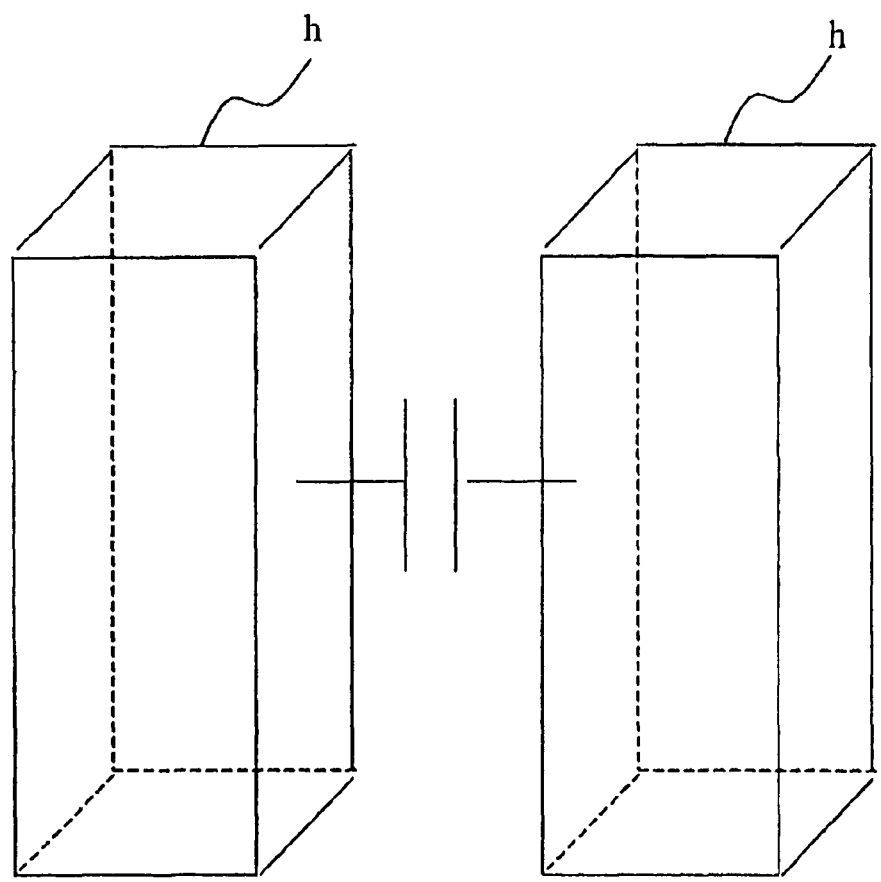
FIG. 15 is a view showing the seventh embodiment of the invention.

With an increase in the integration of a semiconductor element, an aspect ratio is increased and the capacities of conductor layers in a contact hole are also increased as shown in an explanatory view of FIG. 15.

According to such a structure, when the capacitor unit is exactly arranged without depending on the vertical and transverse directions of the power wiring, a capacitor can be formed well even if a connection is carried out in any direction. Thus, the degree of freedom can be acquired over a layout and a semiconductor device capable of easily forming a pattern can be obtained. By utilizing an upper wiring and a lower wiring, moreover, a capacity can be formed three-dimensionally, that is, in a vertical direction, a transverse direction and an oblique direction. Thus, it is possible to obtain a large decoupling capacity in a very small area.

Furthermore, all overlapping regions in the vertical direction, the transverse direction and the oblique direction become capacities. By utilizing the very small area at a maximum, therefore, it is possible to obtain a large decoupling capacity.

Moreover, only a connecting region is exactly superposed on the wiring pattern. Consequently, the layout can easily be obtained and a reliability can be enhanced.

Figure 16:
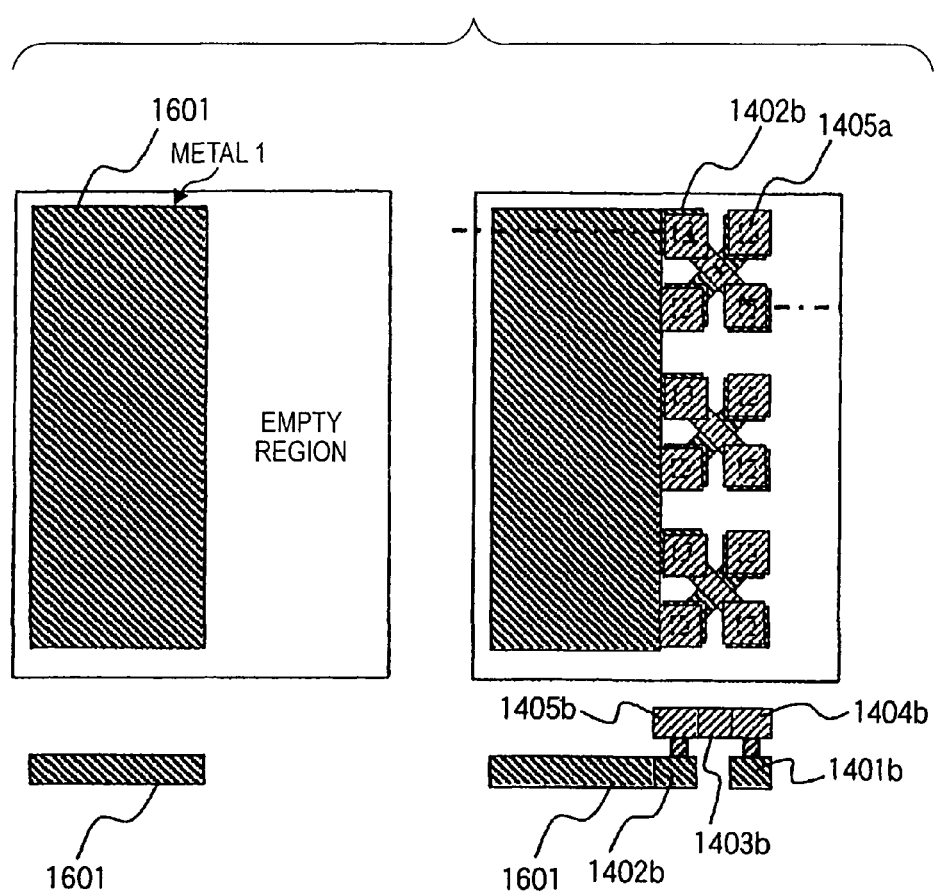
FIG. 16 is a view showing the seventh embodiment of the invention.

Referring to the capacitor unit, as shown in FIG. 16, for example, a power supply or a metal wiring such as a ground wiring, and desirably, at least one of the sides of the square is formed along the edge of a metal wiring 1601 and is electrically connected to the metal wiring 1601 through one of the pads. More specifically, the pads of one of first and second patterns 1602A and 1602B of a capacitor unit 1602 are alternately connected and any of the pads is connected to a wiring having another electric potential.

According to such a structure, only a connecting region is exactly superposed on the wiring pattern of the metal wiring. Consequently, a layout can easily be obtained and a capacity can readily be added by utilizing an empty region.

Figure 17:
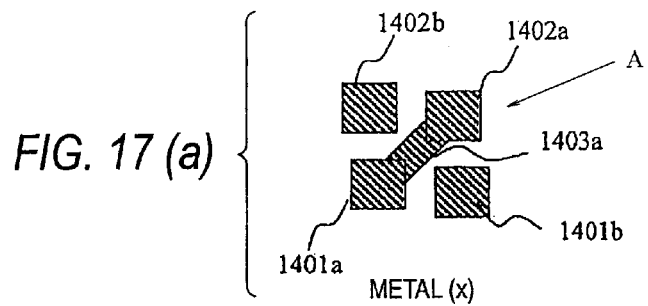
FIG. 17 is a view showing the seventh embodiment of the invention.
Figure 17:
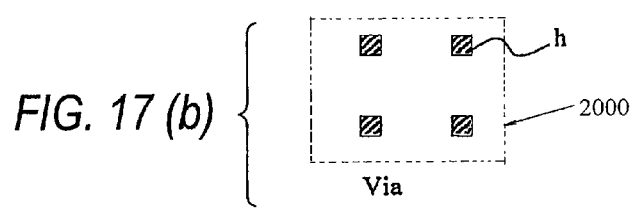
Figure 17:
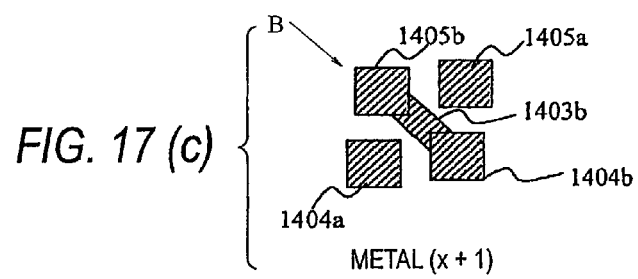
Figure 17:
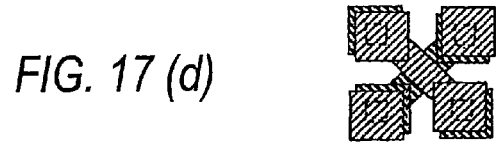
Figure 17:
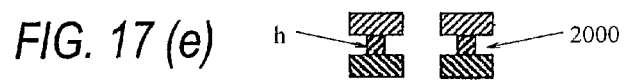

FIGS. 17(a) to 17(e) are views for explaining the pattern structure of the capacitor unit. As shown in FIG. 17(a), a first rod pattern 1403a having first and second lower pads 1401a and 1402a and first and second lower pads 1401b and 1402b are formed on both ends in a first layer wiring (lower wiring). After an interlayer insulating film 2000 is formed, a contact hole h is formed to come in contact with each pad as shown in FIG. 17(b). Then, a second layer wiring (upper wiring) is formed and is subjected to patterning, thereby forming a second rod pattern 1403*b* having third and fourth upper pads 1404*b* and 1405*b* and first and second upper pads 1404*a* and 1405*a* on both ends in a second layer wiring as shown in FIG. 17(*c*). FIG. 17(*d*) shows a state in which they are superposed and FIG. 17(*e*) is a sectional view.

Figure 18:
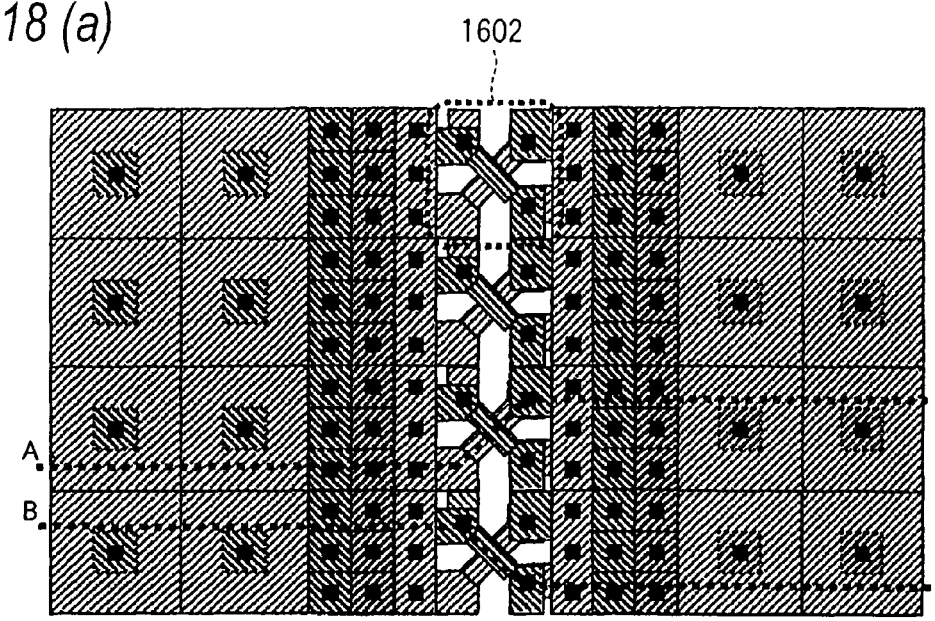
FIG. 18 is a view showing an eighth embodiment of the invention.
Figure 18:
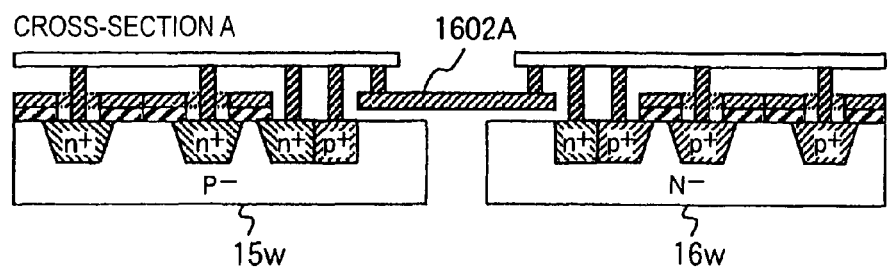
Figure 18:
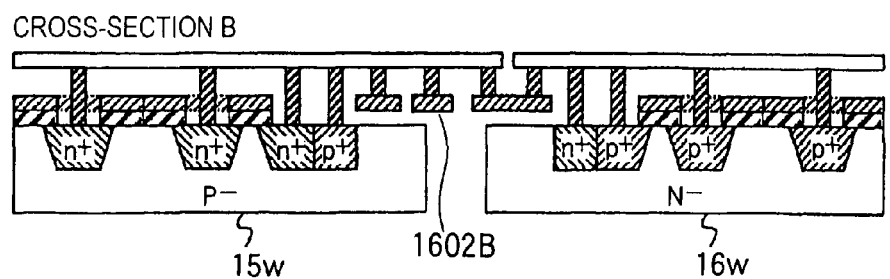

In the sixth embodiment, the description has been given to the example in which the gate wirings are alternately extended and are thus connected in the case in which the bypass capacitor is formed under the power wiring region and in the ground wiring region. In this example, the deformed pattern of the capacitor unit (see FIG. 14) described in the seventh embodiment is arranged in place of the extension of the gate wiring and is used as a joint cell 1602 as shown in FIGS. 18(*a*) to 18(*c*) (FIGS. 18(*b*) and 18(*c*) are A-A and B-B sectional views of FIG. 18(*a*) respectively). In FIG. 18(*a*), a metal layer is not shown.

According to such a structure, automation can easily be carried out with a simple structure and a capacity can also be formed in the joint cell itself comprising first patterns 1602A and 1602B. Consequently, it is possible to form a capacitor having a large capacity in a very small region.

Ninth Embodiment

Figure 19:
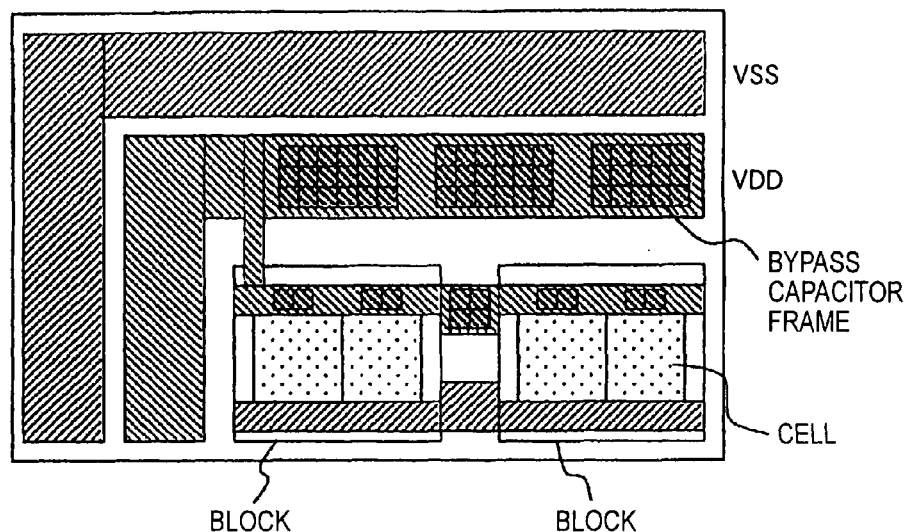
FIG. 19 is a view showing a ninth embodiment of the invention.
Figure 19:
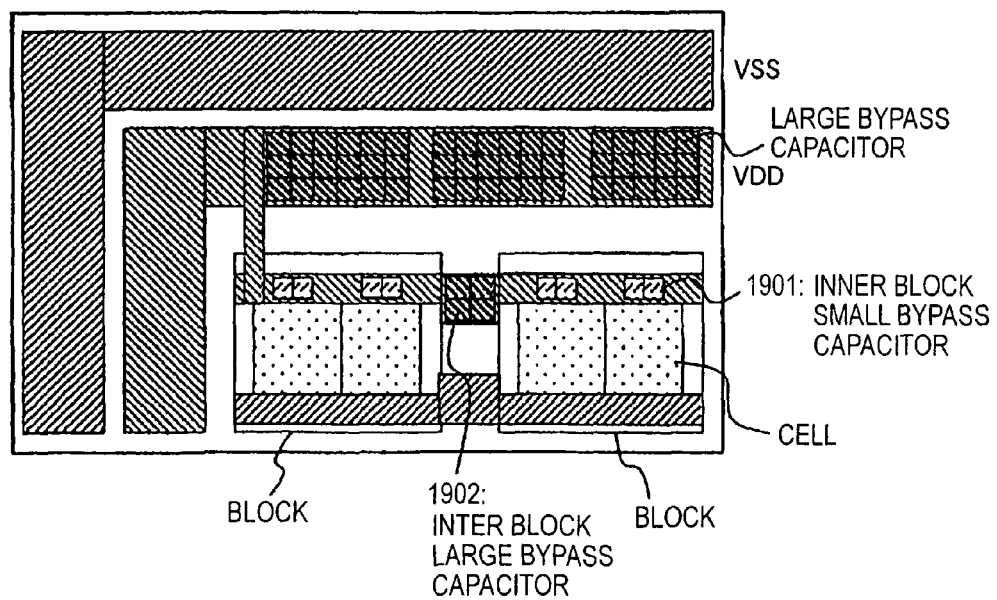
Figure 20:
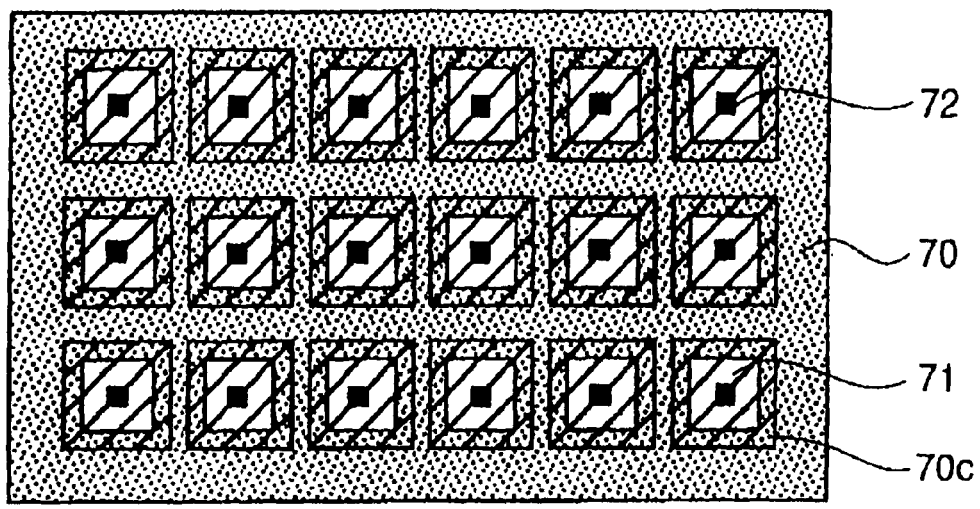
FIG. 20 is a view showing an example of a bypass capacitor according to a conventional example.

A semiconductor device is characterized in that a bypass capacitor constituting a decoupling capacity to be inserted corresponding to a circuit in a chip is divided into a bypass capacitor 1901 for a small capacity region and a bypass capacitor 1902 for a large capacity region as shown in FIG. 19(*a*).

Each bypass capacitor comprises different capacitive insulating films from each other and is constituted in such a manner that a capacity per unit area is varied in a chip. FIG. 19(*b*) shows a semiconductor device provided with a bypass capacitor having a constant capacity illustrated for comparison.

In consideration of the specifications, the situation of the region is decided from a design rule and bypass capacitors having different characteristics are projected to be provided for respective regions. A high breakdown voltage is required for a countermeasure against a surge in the outer peripheral portion of a chip which is close to a power supply, while the high breakdown voltage is not particularly required in an inner part. For this reason, the thickness of a gate insulating film is increased in the vicinity of the outer periphery of the chip and is reduced in the inner part.

Moreover, it is also possible to employ a method in which a gate insulating film having a multilayer structure is formed in only the vicinity of the outer periphery of the chip.

Furthermore, a frequency characteristic is important in the vicinity of a functional element. While a bypass capacitor having a large capacity is to be formed for a high frequency, a proper bypass capacitor is selected corresponding to a frequency band to be used in order to have a small capacity for a low frequency.

In consideration of the specifications, thus, the situation of a region is decided from the design rule to provide bypass capacitors having different characteristics for the respective regions. Consequently, it is possible to provide a semiconductor device having a more excellent characteristic and a higher reliability.

While the invention has been described in detail with reference to the specific embodiments, it is apparent for the skilled in the art that various changes and modifications can be made without departing from the spirit and scope of the invention.

The application is based on Japanese Patent Application (No. 2001-356279) filed in Nov. 21, 2001 and the contents are quoted by reference.

INDUSTRIAL APPLICABILITY

As described above, in the semiconductor device according to the invention, a diffusion region is formed to be extended under the empty region. Consequently, it is possible to form the capacitor by utilizing the empty region without increasing a chip area with a simple structure. Thus, a noise can be reduced. In the generation of a pattern, moreover, the layout pattern of a chip is generated and an adjacent empty region to a region in which a decoupling capacity can be generated under the power wiring (a place in which other layers are not present at all) is then searched automatically by utilizing a graphic logical operation and a resize processing, and the region thus searched is utilized as a decoupling capacity arrangement region. Thus, a pattern can be generated automatically and a noise can be reduced with high precision.

Furthermore, a wiring layer to be a connecting destination can also be formed as a pattern. Thus, a noise can be reduced with higher precision. At this time, it is necessary to carry out the arrangement to observe a design rule. Consequently, it is possible to form a reliable pattern with higher precision.

Moreover, the bypass capacitor is constituted by a plurality of unit cells and the unit cells are arranged in a matrix in the empty region. Thus, the units are arranged so that it is possible to easily carry out an operation and to readily form a pattern at a high speed in the automatic formation.

It is desirable that the diffusion region having the one conductivity type should have the same conductivity type as that of the diffusion region of the substrate contact. Consequently, a connection to the substrate contact can easily be carried out and a connecting resistance can be reduced.

It is desirable that the diffusion region having the one conductivity type should have a different conductivity type from that of the diffusion region of the substrate contact, and the substrate contact and the diffusion region having the first conductivity type should be connected to each other through a silicide layer formed on a surface of the diffusion region of the substrate contact. Therefore, there is a problem in that a region having a small number of carriers is formed on an interface because of a reverse conductivity type and a connecting resistance is thus increased if the connection is to be carried out at the diffusion layer in the connecting portion to the substrate contact. By siliciding, the diffusion region provided under the gate electrode is connected through the silicide layer provided on the surface of the diffusion region. Consequently, the connecting resistance can be improved so that an excellent bypass capacitor can be obtained.

It is desirable that the diffusion region of the substrate contact should be constituted by a first diffusion region to be an extended region of a diffusion region having the same conductivity type as that of the diffusion region having the one conductivity type and a second diffusion region having a different conductivity type from that of the diffusion region having the one conductivity type, and the first and second diffusion regions should be connected to a ground wiring through the substrate contact and constitute a decoupling capacity having an MOS transistor structure. Consequently, the capacitor having the MOS transistor structure can be formed so that the capacity can be increased.

It is desirable that the bypass capacitor should include a capacitor region having a diffusion region having one conductivity type and a square gate electrode formed integrally with a surface of the diffusion region having the one conductivity type through a capacitive insulating film, and a diffusion region to surround an outer periphery of the capacitor region, and a diffusion region of a substrate contact should be connected through the diffusion region and a power wiring to be an upper layer should be connected to a surface of the gate electrode through a plurality of contacts so that an MOS transistor structure is constituted. In addition to the advantages, consequently, there is provided the diffusion region on the outer periphery of the capacity region. Therefore, it is possible to connect a connecting diffusion region in every direction irrespective of a direction in which a power wiring is extended. Consequently, the degree of freedom of a layout can also be increased. Furthermore, a square shape is taken. Therefore, an array can freely be obtained. In case of a multi-array, the arrangement can be carried out efficiently and the degree of freedom of the array can also be increased.

Moreover, the invention provides a semiconductor device comprising a first bypass capacitor including an MOS structure formed under a power wiring region and having a gate electrode formed on a first diffusion region having one conductivity type through a capacitive insulating film, having a wiring extended from the power wiring side to the ground wiring side and connected to a necessary diffusion potential for forming a transistor capacity of the bypass capacitor on the ground wiring side, and a second bypass capacitor including an MOS structure formed under a ground wiring region and having a gate electrode formed on a diffusion region having a different conductivity type from that of the first diffusion region through a capacitive insulating film, having a wiring extended from the ground wiring side to the power wiring side and connected to a necessary diffusion potential for forming a transistor capacity of the bypass capacitor on the power wiring side. Consequently, a capacitive element is constituted on both the power supply side and the ground side. Thus, it is possible to obtain a bypass capacitor having a large capacity in a very small area.

It is desirable that the opening portion for forming a contact region should be provided on the gate electrode of the bypass capacitor. By coming in contact with the diffusion region through the opening portion, the gate electrode and the diffusion region can be connected to have different electric potentials. For example, the formation can be carried out in any of adjacent regions to the power wiring and the ground wiring. Thus, the decoupling capacity can be added by utilizing an empty region.

It is desirable that the bypass capacitor should be generated in a minimum graphic dimension of a wiring pattern rule for manufacturing a semiconductor. Consequently, a pattern design can automatically be carried out.

It is desirable that a plurality of bypass capacitors should be present in an array under the power wiring. Consequently, a capacitor having a large capacity can be formed more efficiently.

Moreover, it is desirable that the bypass capacitor should comprise capacitive insulating films which are different from each other and should be formed in such a manner that a capacity per unit area is varied in a chip. According to such a structure, in consideration of the specifications, the situation of the region can be decided from a design rule and bypass capacitors having different characteristics for respective regions can be provided.

Furthermore, the invention provides a semiconductor device comprising a first pattern including a first rod pattern constituted by a lower wiring formed on a surface of the semiconductor device and having first and second lower pads on both ends, and third and fourth upper pads formed in opposite positions to each other through an interlayer insulating film on the first and second lower pads, connected to the first and second lower pads through a contact hole and constituted by an upper wiring in such a manner that each pad is positioned in an almost square corner portion, a second pattern including a second rod pattern constituted by an upper wiring formed on the lower wiring through an interlayer insulating film, having third and fourth upper pads on both ends and formed opposite in an orthogonal direction to the first rod pattern, and first and second lower pads formed in opposite positions to each other through an interlayer insulating film on the third and fourth upper pads, connected to the third and fourth upper pads through a contact hole and constituted by a lower wiring in such a manner that each pad is positioned in an almost square corner portion, and a capacitor unit pattern constituted to connect one of the pads of each of the first and second patterns to have a different electric potential. By exact arrangement without depending on the vertical and transverse directions of the power wiring, consequently, a capacitor can be formed well even if a connection is carried out in any direction. Thus, the degree of freedom can be acquired over a layout and a semiconductor device capable of easily forming a pattern can be obtained. By utilizing an upper wiring and a lower wiring, moreover, a capacity can be formed three-dimensionally, that is, in a vertical direction, a transverse direction and an oblique direction. Thus, it is possible to obtain a large decoupling capacity in a very small area.

It is desirable that the first and second rod patterns should have almost the same widths and lengths, and the first pattern and the second pattern should be constituted to almost overlap with each other. Consequently, all overlapping regions in the vertical direction, the transverse direction and the oblique direction become capacities. By utilizing the very small area at a maximum, therefore, it is possible to obtain a large decoupling capacity.

Moreover, it is desirable that edges of the pads for layers which are positioned so as not to vertically overlap with each other should be protruded from sides of the square and constitute a connecting region, and a shift region between the patterns should be formed point symmetrically in such a manner that only one connecting region is protruded from each of the first pattern and the second pattern on each of the sides. Consequently, only a connecting region is exactly superposed on the wiring pattern. Thus, the layout can easily be carried out and a reliability can be enhanced.

Furthermore, it is desirable that at least one of the sides of the square should be formed along an edge of a metal wiring and should be electrically connected to the metal wiring through one of the pads. Consequently, only the connecting region is exactly superposed on the wiring pattern of the metal wiring. Thus, the layout can easily be obtained and a reliability can be enhanced.

It is desirable that at least one of the sides of the square should be formed along an edge of a metal wiring and capacitor unit patterns in plural lines should be provided in such a manner that the side is electrically connected to the metal wiring through one of the pads. Consequently, a necessary capacity can be added efficiently. Moreover, the degree of freedom of a layout can be increased and a semiconductor device having a high reliability can easily be obtained.

In the method according to the invention, the empty region is detected and the bypass capacitor is additionally provided in the empty region. Therefore, automatic formation can easily be carried out and a pattern layout can readily be obtained efficiently.

It is desirable that the pattern of the power wiring has already been generated prior to the generation of the pattern of the bypass capacitor. Consequently, it is possible to automatically generate the pattern of the bypass capacitor included in the pattern of the power wiring. More specifically, a semiconductor device having a high integration and a small power noise can be formed based on a pattern provided automatically.

It is desirable that the bypass capacitor arrangement resizing step should serve to provide a bypass capacitor and to increase or reduce a numeric value of a half of an interval between the bypass capacitors to regulate data for forming a gate electrode, thereby increasing and decreasing a capacitance value. Consequently, pattern data can easily be obtained efficiently. As data for forming a gate electrode, for example, polysilicon data, metal electrode data or metal silicide data are used.

As described above, according to the structure, it is possible to automatically form the layout pattern of a semiconductor device capable of effectively executing the absorption of a power noise and implementing the stable operation of a circuit.

The invention claimed is:

1. A semiconductor device comprising:
    a bypass capacitor including an MOS structure formed to be extended from a power wiring region of the semiconductor device to a portion provided under an empty region which is adjacent to the power wiring region and has no other functional layer, and having a gate electrode formed through a capacitive insulating film on a diffusion region having a first conductivity type; and
    a substrate contact formed under a ground wiring region and fixing a substrate potential, wherein:
    the bypass capacitor has a contact to come in contact with a power wiring which is formed on a surface of the gate electrode and includes the diffusion region having the first conductivity type and a diffusion region of the substrate contact connected to each other,
    the bypass capacitor has an opening portion for forming a contact region, and
    the diffusion region is connected to have a different electric potential from that of the gate electrode through a diffusion contact to come in contact with the diffusion region through the opening portion.

2. A semiconductor device comprising:
    a first pattern including a first rod pattern constituted by a lower wiring formed on a surface of the semiconductor device and having first and second lower pads on both ends, and third and fourth upper pads formed in opposite positions to each other through an interlayer insulating film on the first and second lower pads, connected to the first and second lower pads through a contact hole and constituted by an upper wiring in such a manner that each pad is positioned in an almost square corner portion;
    a second pattern including a second rod pattern constituted by an upper wiring formed on the lower wiring through an interlayer insulating film, having third and fourth upper pads on both ends and formed opposite in an orthogonal direction to the first rod pattern, and first and second lower pads formed in opposite positions to each other through an interlayer insulating film on the third and fourth upper pads, connected to the third and fourth upper pads through a contact hole and having first and second lower pads constituted by a lower wiring in such a manner that each pad is positioned in an almost square corner portion; and
    a capacitor unit pattern constituted to connect one of the pads of each of the first and second patterns to have a different electric potential.

3. The semiconductor device according to claim 2, wherein the first and second rod patterns have almost the same widths and lengths, and the first pattern and the second pattern are constituted to almost overlap with each other.

4. The semiconductor device according to claim 3, wherein edges of the pads for layers which are positioned so as not to vertically overlap with each other are protruded from sides of the square and constitute a connecting region, and a shift region between the patterns is formed point symmetrically in such a manner that only one connecting region is protruded from each of the first pattern and the second pattern on each of the sides.

5. The semiconductor device according to claim 3, wherein at least one of the sides of the square is formed along an edge of a metal wiring and is electrically connected to the metal wiring through one of the pads.

6. The semiconductor device according to claim 3, wherein at least one of the sides of the square is formed along an edge of a metal wiring and capacitor unit patterns in plural lines are provided in such a manner that the side is electrically connected to the metal wiring through one of the pads.

* * * * *